United States Patent
Takahashi et al.

(10) Patent No.: US 9,118,128 B2
(45) Date of Patent: Aug. 25, 2015

(54) ELECTRIC CONNECTOR HAVING A REINFORCEMENT FRAME

(71) Applicant: Japan Aviation Electronics Industry, Ltd., Tokyo (JP)

(72) Inventors: Takeshi Takahashi, Tokyo (JP); Osamu Hashiguchi, Tokyo (JP)

(73) Assignee: Japan Aviation Electronics Industry, Ltd., Tokyo (JP)

( * ) Notice: Subject to any disclaimer, the term of this patent is extended or adjusted under 35 U.S.C. 154(b) by 174 days.

(21) Appl. No.: 13/865,686

(22) Filed: Apr. 18, 2013

(65) Prior Publication Data

US 2013/0323977 A1 Dec. 5, 2013

(30) Foreign Application Priority Data

May 30, 2012 (JP) .................................. 2012-123350

(51) Int. Cl.
| | |
|---|---|
| *H01R 4/58* | (2006.01) |
| *H01R 13/11* | (2006.01) |
| *H01R 13/24* | (2006.01) |
| *H01R 13/436* | (2006.01) |
| *H05K 7/10* | (2006.01) |

(52) U.S. Cl.
CPC ................ *H01R 13/11* (2013.01); *H01R 13/24* (2013.01); *H01R 13/4367* (2013.01); *H05K 7/1053* (2013.01)

(58) Field of Classification Search
CPC .. H01R 13/11; H01R 13/405; H01R 13/2414; H01R 23/722; H05K 7/1069
USPC ........................... 439/626, 91, 66, 591, 70, 71
See application file for complete search history.

(56) References Cited

U.S. PATENT DOCUMENTS

| | | | | |
|---|---|---|---|---|
| 7,329,130 | B2 * | 2/2008 | Saito et al. ....................... | 439/66 |
| 7,537,462 | B2 * | 5/2009 | Higuchi et al. .................. | 439/71 |
| 7,614,884 | B2 * | 11/2009 | Kuwahara et al. .............. | 439/66 |
| 7,654,827 | B2 * | 2/2010 | Arai et al. ........................ | 439/66 |
| 7,862,349 | B1 * | 1/2011 | Takahashi et al. .............. | 439/91 |
| 8,870,580 | B2 * | 10/2014 | Kojima et al. .................. | 439/66 |
| 2006/0035486 | A1 * | 2/2006 | Higuchi et al. .................. | 439/66 |
| 2007/0077786 | A1 | 4/2007 | Saito et al. | |
| 2013/0316588 | A1 * | 11/2013 | Kojima et al. ................. | 439/638 |
| 2013/0330971 | A1 * | 12/2013 | Kojima et al. ................. | 439/626 |
| 2013/0344741 | A1 * | 12/2013 | Takahashi et al. ............ | 439/626 |

FOREIGN PATENT DOCUMENTS

JP   2005-108656 A   4/2005

OTHER PUBLICATIONS

Chinese Official Action dated Feb. 2, 2015, in CN Application No. 201310118248.3.

* cited by examiner

*Primary Examiner* — Hae Moon Hyeon
(74) *Attorney, Agent, or Firm* — Maier & Maier, PLLC

(57) ABSTRACT

Provided is a technique for achieving a narrower pitch without causing any problem in terms of contact force and strength at each contact point. A socket includes a frame body including an outer peripheral frame and a plurality of elongated slit frames arranged in parallel with each other on the inside of the outer peripheral frame; a plurality of contact blocks inserted between the adjacent slit frames and held on the frame body; and a reinforcement frame formed separately from the frame body and mounted on the frame body so as to intersect the slit frames.

12 Claims, 30 Drawing Sheets

RELATED ART

ELECTRIC CONNECTOR HAVING A REINFORCEMENT FRAME

RELATED APPLICATIONS

This application claims priority under 35 U.S.C. §119 to Japanese Patent Application No. 2012-123350, filed on May 30, 2012, the disclosure of which is incorporated by reference herein in its entirety.

BACKGROUND OF THE INVENTION

1. Field of the Invention

The present invention relates to an electric connector.

2. Description of Related Art

As a technique of this type, Japanese Unexamined Patent Application Publication No. 2005-108656 discloses a connector suitable for mounting an Integrated Circuit (IC) package such as a land grid array (LGA) on a printed wiring board. As shown in FIGS. 29 and 30, this connector includes an insulator 100 having a flat plate shape; a number of elastic bodies 101 which are fixed and held onto the insulator 100 and have a substantially prism shape or a substantially square-bar shape; and a number of conductors 102 which are formed on the respective elastic bodies 101 and have a thin film shape. The insulator 100 includes a number of slits 103 which are adjacent to each other in parallel. A connection member 104 including a number of conductors 102 formed on the peripheral surface of the respective elastic bodies 101 is inserted into each slit 103 of the insulator 100 and held on the insulator 100.

SUMMARY OF THE INVENTION

To achieve a narrower pitch in the structure disclosed in Japanese Unexamined Patent Application Publication No. 2005-108656 described above, it is necessary to reduce the thickness of the connection member 104 itself or to reduce the thickness of each frame that partitions the adjacent slits 103.

However, if the connection member 104 itself is reduced in thickness, the rigidity of the connection member 104 is lowered, which results in a reduction in contact force at each contact point between the conductors 102. Meanwhile, if each frame that partitions the adjacent slits 103 is reduced in thickness, the frame itself may be damaged due to an insufficient strength.

Accordingly, it has been difficult to achieve a narrower pitch in terms of contact force and strength at each contact point.

It is an object of the present invention to provide a technique for achieving a narrower pitch without causing any problem in terms of contact force and strength at each contact point.

An exemplary aspect of the present invention is an electric connector including: a frame body including an outer peripheral frame and a plurality of elongated slit frames, the slit frames being arranged in parallel with each other on an inside of the outer peripheral frame; a plurality of connection members inserted between the adjacent slit frames and held on the frame body; and a reinforcement frame formed separately from the frame body and mounted on the frame body so as to intersect the plurality of slit frames.

Preferably, the reinforcement frame includes a reinforcement frame body extending so as to intersect the plurality of slit frames, and a plurality of protrusions protruding from the reinforcement frame body and inserted between the adjacent slit frames.

Preferably, each of the connection members is sandwiched between each of the slit frames and each of the protrusions of the reinforcement frame.

Preferably, each of the connection members includes a viscoelastic body and a core, and the core of each of the connection members is sandwiched between each of the slit frames and each of the protrusions of the reinforcement frame.

Preferably, the viscoelastic body of each of the connection members has a protrusion inserting groove in which each of the protrusions of the reinforcement frame is inserted.

Preferably, the viscoelastic body of each of the connection members has a body inserting groove in which the reinforcement frame body of the reinforcement frame is inserted.

Preferably, the plurality of protrusions of the reinforcement frame is formed in a comb-teeth shape.

Preferably, the plurality of protrusions of the reinforcement frame is formed in a triangular wave shape.

Preferably, each of the connection members is divided at a position of the reinforcement frame.

Preferably, the outer peripheral frame has an outer peripheral frame reinforcement frame inserting groove in which the reinforcement frame is inserted.

Preferably, the plurality of slit frames has a slit frame reinforcement frame inserting groove in which the reinforcement frame is inserted.

Preferably, the reinforcement frame consists of a metallic plate or a resin sheet.

According to an exemplary aspect of the present invention, the reinforcement frame intersects the plurality of slit frames, which prevents the slit frames from being easily deformed and poses no problem in terms of strength even when the slit frames are reduced in thickness. Accordingly, instead of reducing the thickness of the contact blocks themselves, the slit frames are reduced in thickness, which contributes to achievement of a narrower pitch. That is, according to this structure, a narrower pitch can be achieved without causing any problem in terms of contact force and strength at each contact point.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

First Exemplary Embodiment

A first exemplary embodiment of the present invention will be described with reference to FIGS. 1 to 22.

Figure 1:
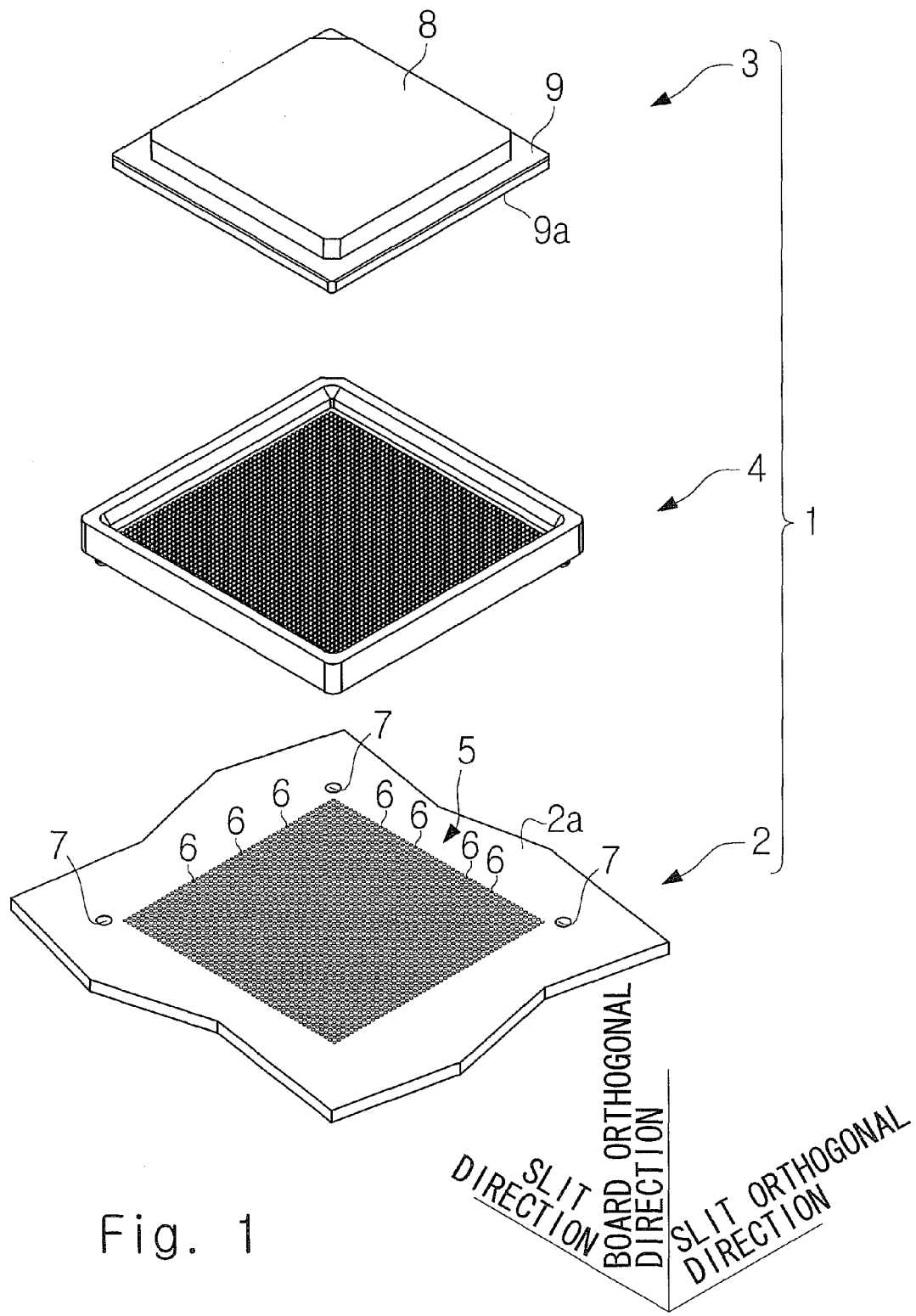
FIG. 1 is a perspective view showing a state before an IC package, a socket, and a printed wiring board are connected (first exemplary embodiment)
Figure 2:
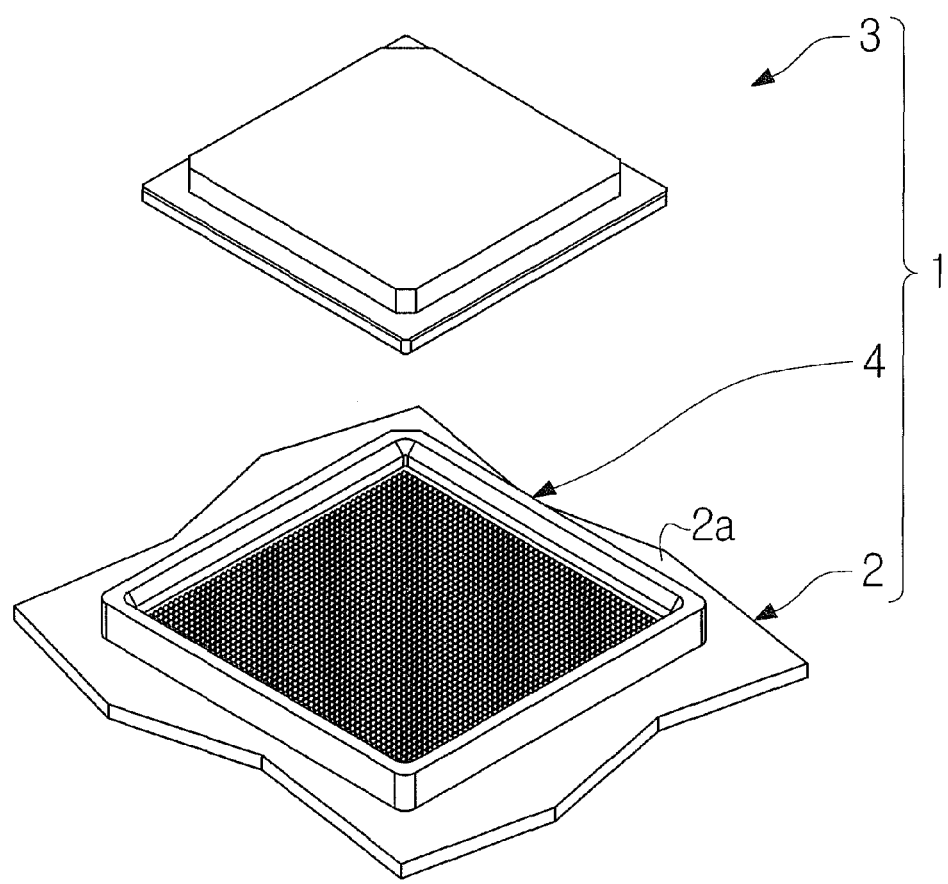
FIG. 2 is a perspective view showing a state before the IC package is set in the socket mounted on the printed wiring board (first exemplary embodiment)
Figure 3:
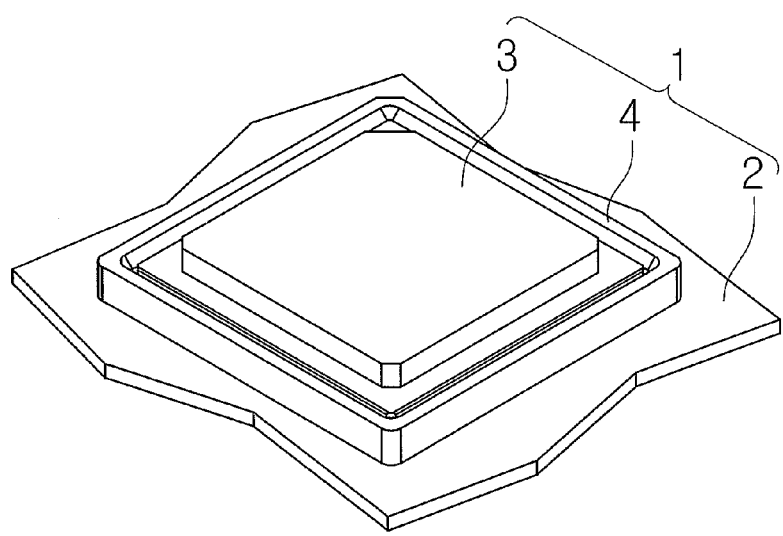
FIG. 3 is a perspective view showing the state in which the IC package is set in the socket mounted on the printed wiring board (first exemplary embodiment)

As shown in FIG. 1, a connection structure 1 (electronic device) includes a printed wiring board 2 (board) on which various electronic components are mounted; an IC package 3 such as a central processing unit (CPU) or a graphics processing unit (GPU); and a socket 4 (electric connector) for electrically connecting the IC package 3 to the printed wiring board 2. To electrically connect the IC package 3 to the printed wiring board 2, the socket 4 is first mounted on a socket mounting surface 2a of the printed wiring board 2 as shown in FIG. 2, and the IC package 3 is set in the socket 4 as shown in FIG. 3. Then, a heat sink which is brought into close contact with the IC package 3 is pressed and fixed to the side of the printed wiring board 2.

(Printed Wiring Board 2)

In the first exemplary embodiment, the printed wiring board 2 is a rigid board such as a paper phenol board or a paper epoxy board. Alternatively, a flexible wiring board may be used.

As shown in FIG. 1, an LGA 5 is formed on the socket mounting surface 2a of the printed wiring board 2. The LGA 5 includes a number of electrode pads 6 which are arranged in a matrix of 50×50. The pitch of the electrode pads 6 is 0.5 mm, for example. Three positioning holes 7 are formed in the socket mounting surface 2a of the printed wiring board 2. The three positioning holes 7 are holes for positioning the socket 4 with respect to the printed wiring board 2.

(IC Package 3)

The IC package 3 includes an IC sealing portion 8 and an IC board 9 on which the IC sealing portion 8 is mounted. An LGA is formed on a socket facing surface 9a of the IC board 9, as with the socket mounting surface 2a of the printed wiring board 2. The LGA includes a number of electrode pads arranged in a matrix of 50×50.

(Socket 4)

Figure 4:
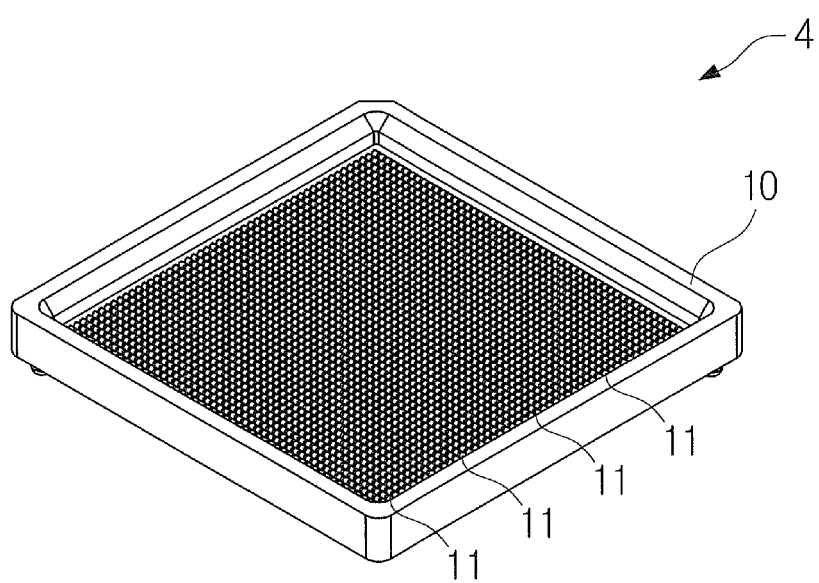
FIG. 4 is a perspective view of the socket (first exemplary embodiment)
Figure 5:
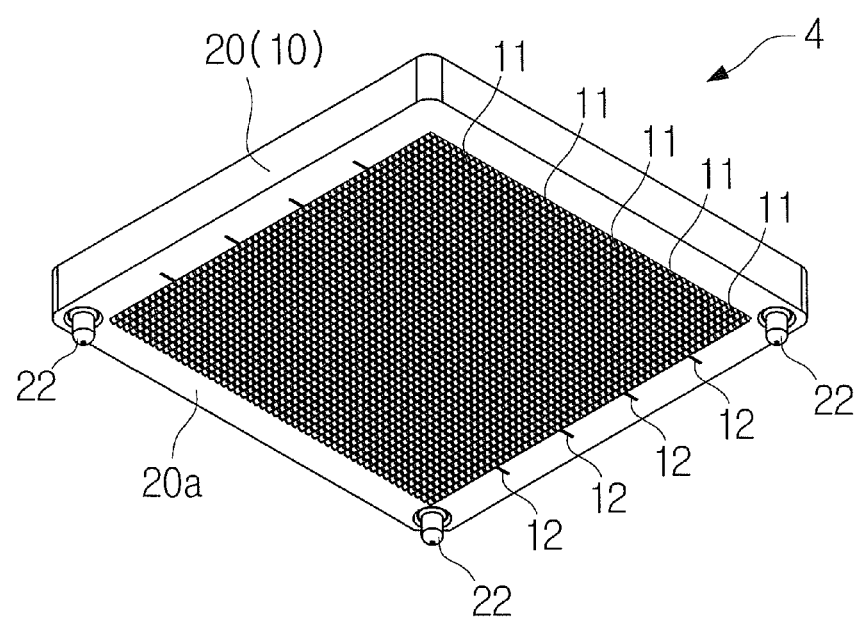
FIG. 5 is a perspective view of the socket viewed from another angle (first exemplary embodiment)
Figure 6:
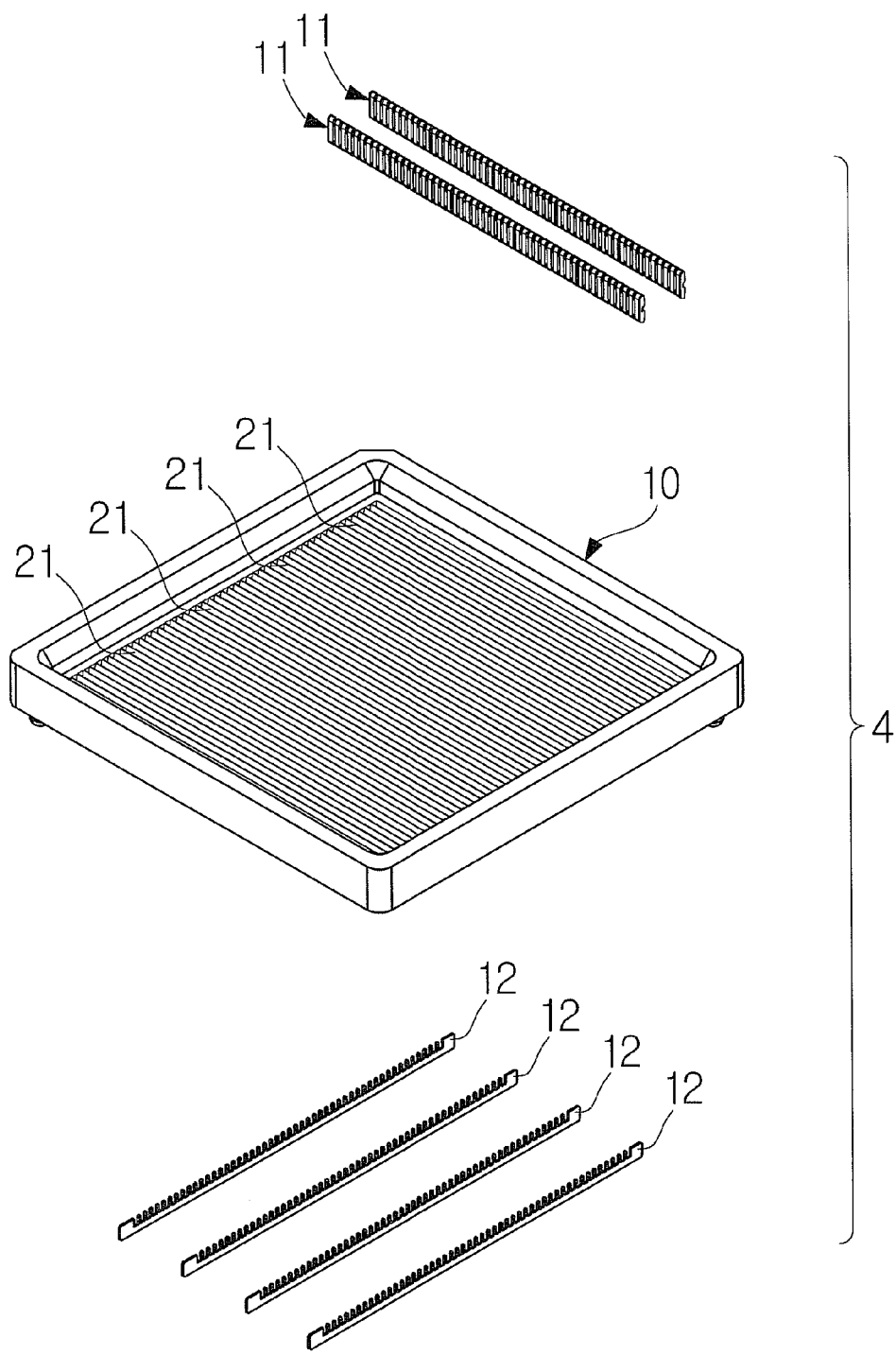
FIG. 6 is an exploded perspective view of the socket (first exemplary embodiment)

As shown in FIGS. 4 to 6, the socket 4 includes a frame body 10, a plurality of contact blocks 11 (connection members), and a plurality of reinforcement frames 12. FIG. 6 illustrates only two contact blocks 11 for convenience of illustration.

(Frame Body 10)

Figure 7:
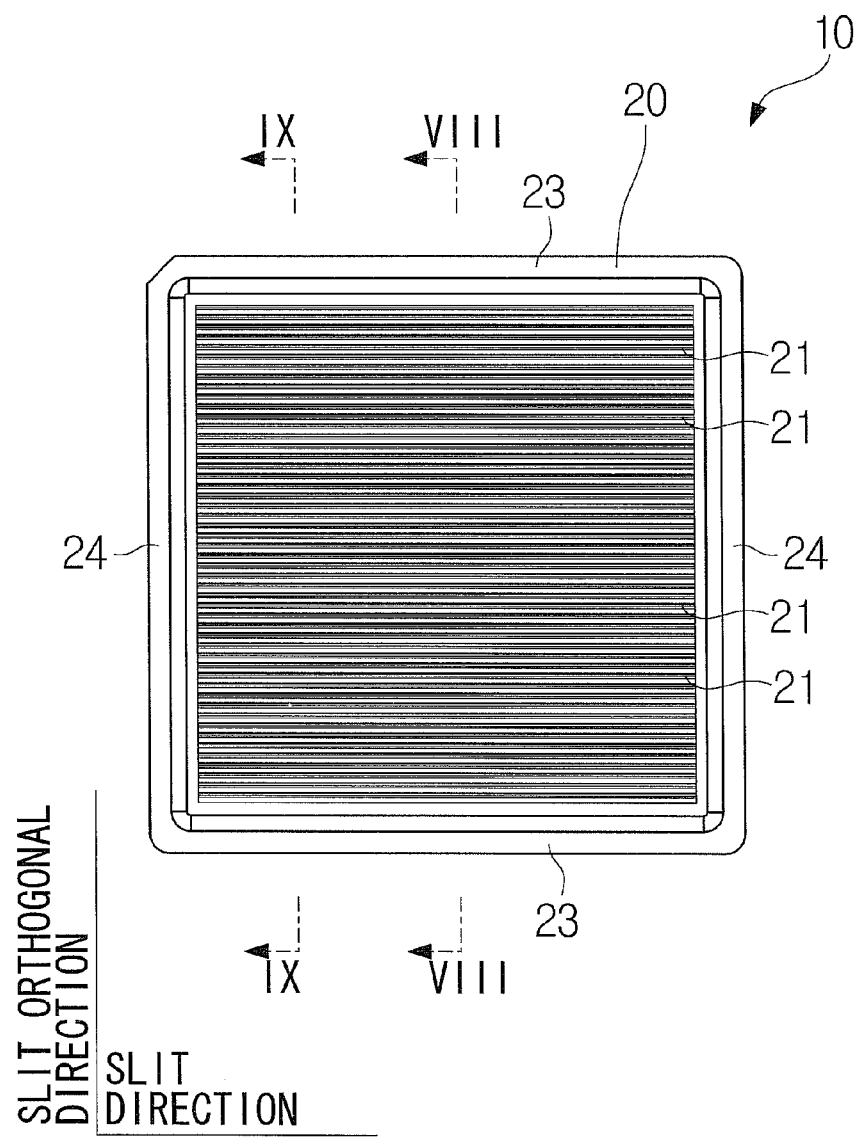
FIG. 7 is a plan view of a frame body (first exemplary embodiment)

As shown in FIG. 7, the frame body 10 includes an outer peripheral frame 20, and a plurality of elongated slit frames 21 which are arranged in parallel with each other on the inside of the outer peripheral frame 20. As shown in FIG. 5, the outer peripheral frame 20 has a board facing surface 20a which faces the socket mounting surface 2a of the printed wiring board 2. The frame body 10 is formed of an insulating resin, for example. In this case, the frame body 10 is integrally formed by injection molding.

The terms "slit direction", "slit orthogonal direction", and "board orthogonal direction" herein used are defined as follows. The slit direction, the slit orthogonal direction, and the board orthogonal direction are directions orthogonal to each other. As shown in FIG. 7, the slit direction indicates the longitudinal direction of each slit frame 21. As shown in FIG. 1, the board orthogonal direction is a direction orthogonal to the socket mounting surface 2a of the printed wiring board 2. In the board orthogonal direction, a direction approaching the socket mounting surface 2a of the printed wiring board 2 is referred to as a board approaching direction, and a direction separating from the socket mounting surface 2a of the printed wiring board 2 is referred to as a board separating direction. As shown in FIG. 7, the slit orthogonal direction indicates a direction in which the slit frames 21 are arranged. In the slit orthogonal direction, one direction is defined as a first slit orthogonal direction, and the other direction direction is defined as a second slit orthogonal direction (also see FIG. 9). The first slit orthogonal direction is a direction opposite to the second slit orthogonal direction.

As shown in FIG. 5, the frame body 10 further includes three positioning pins 22. The three positioning pins 22 are formed so as to protrude in the board approaching direction from the board facing surface 20a of the outer peripheral frame 20.

(Frame Body 10: Outer Peripheral Frame 20)

As shown in FIG. 7, the outer peripheral frame 20 includes a pair of first outer peripheral frames 23 extending in the slit direction, and a pair of second outer peripheral frames 24 extending in the slit orthogonal direction. The pair of first outer peripheral frames 23 and the pair of second outer peripheral frames 24 are arranged so as to surround the slit frames 21, thereby constituting the rectangular outer peripheral frame 20.

(Frame Body 10: Slit Frame 21)

Figure 8:
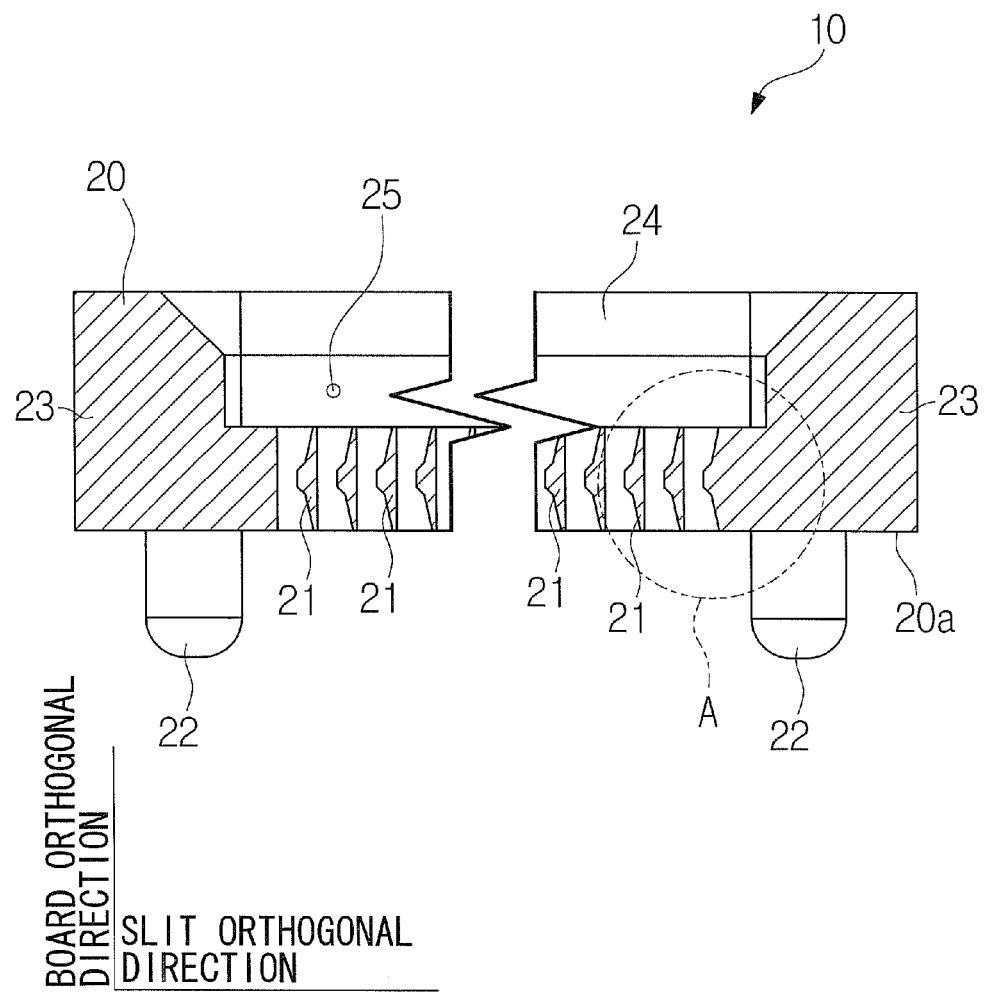
FIG. 8 is a sectional view taken along the line VIII-VIII of FIG. 7 (first exemplary embodiment)

As shown in FIG. 8, the slit frames 21 are connected to an end in the board approaching direction of each second outer peripheral frame 24. A package accommodating space 25 is formed on the inside of the outer peripheral frame 20. The package accommodating space 25 is formed on the opposite side of the printed wiring board 2 with the slit frames 21 interposed therebetween.

Figure 9:
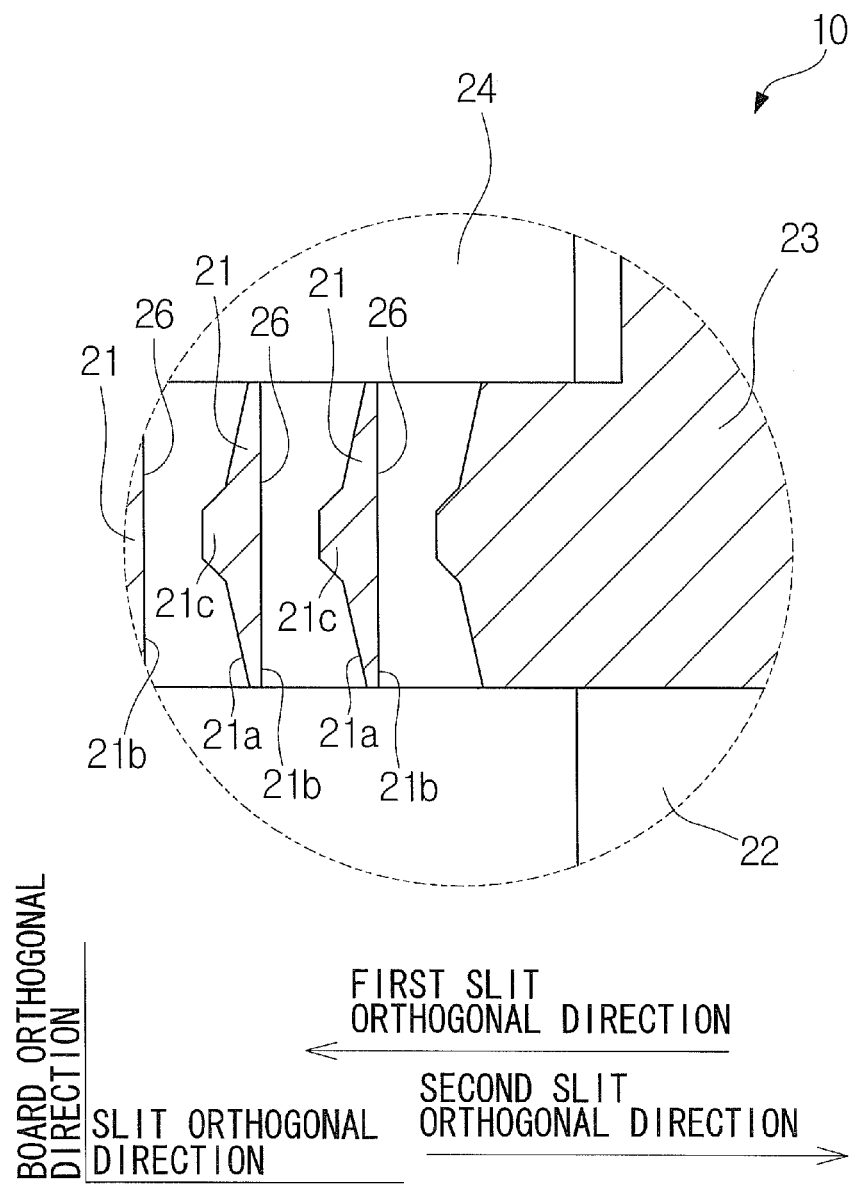
FIG. 9 is an enlarged view of a portion "A" shown in FIG. 8 (first exemplary embodiment)

As shown in FIG. 9, the slit frames 21 are arranged at predetermined intervals in the slit orthogonal direction. Each slit 26 is formed between the adjacent slit frames 21.

Each slit frame 21 is formed in a substantially plate shape orthogonal to the slit orthogonal direction. In the first exemplary embodiment, each slit frame 21 is formed with a small thickness so as to achieve a narrow pitch. Each slit frame 21 includes a first slit side surface 21$a$ which faces the first slit orthogonal direction, and a second slit side surface 21$b$ which faces the second slit orthogonal direction. At a central portion in the board orthogonal direction of the first slit side surface 21$a$, a protrusion 21$c$ (engaging portion) which protrudes in the first slit orthogonal direction is formed. The protrusion 21$c$ protrudes toward the second slit side surface 21$b$ of the adjacent slit frame 21 from the central portion in the board orthogonal direction of the first slit side surface 21$a$. The second slit side surface 21$b$ is a flat surface orthogonal to the slit orthogonal direction.

Figure 10:
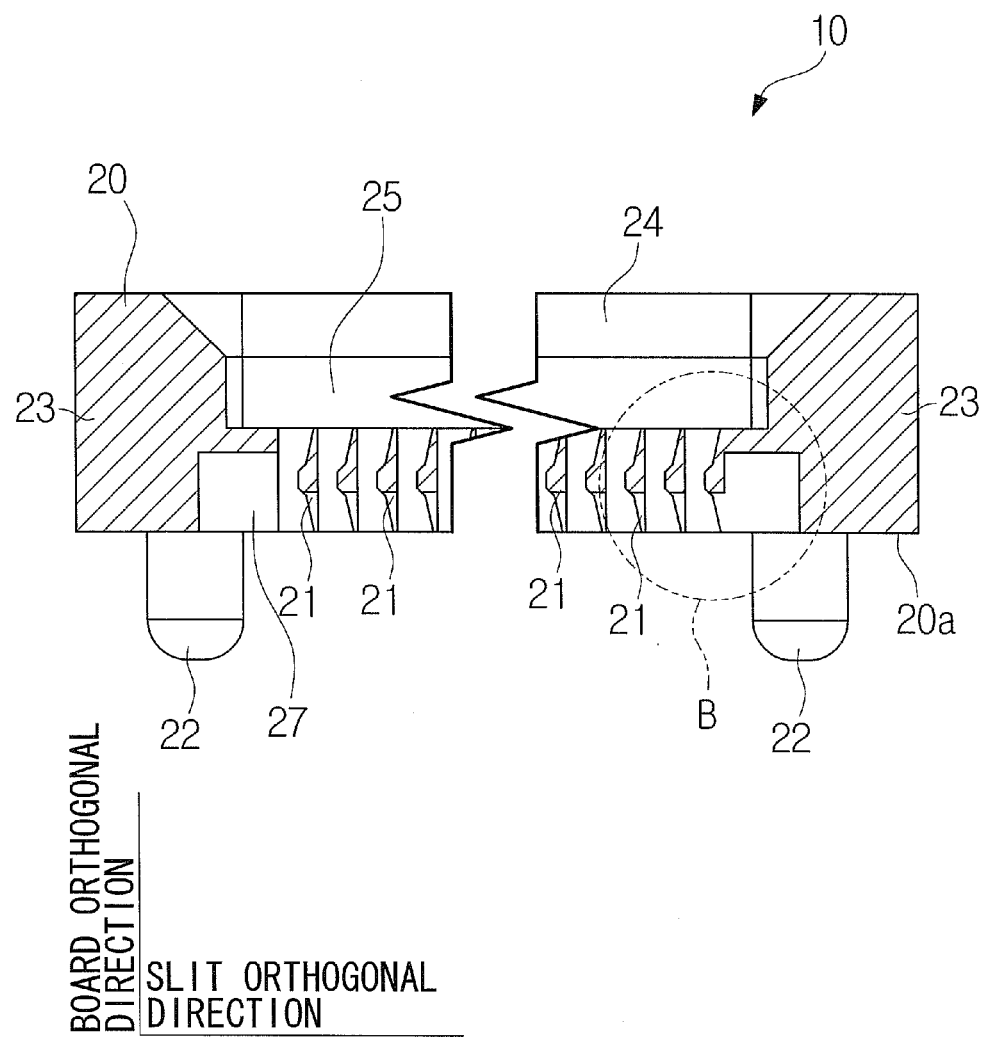
FIG. 10 is a sectional view taken along the line IX-IX of FIG. 7 (first exemplary embodiment)

As shown in FIG. 10, the frame body 10 has frame body reinforcement frame inserting grooves 27 for mounting the reinforcement frames 12 on the frame body 10. In the first exemplary embodiment, four reinforcement frames 12 are mounted on the frame body 10. Accordingly, the frame body 10 has four frame body reinforcement frame inserting grooves 27.

Figure 11:
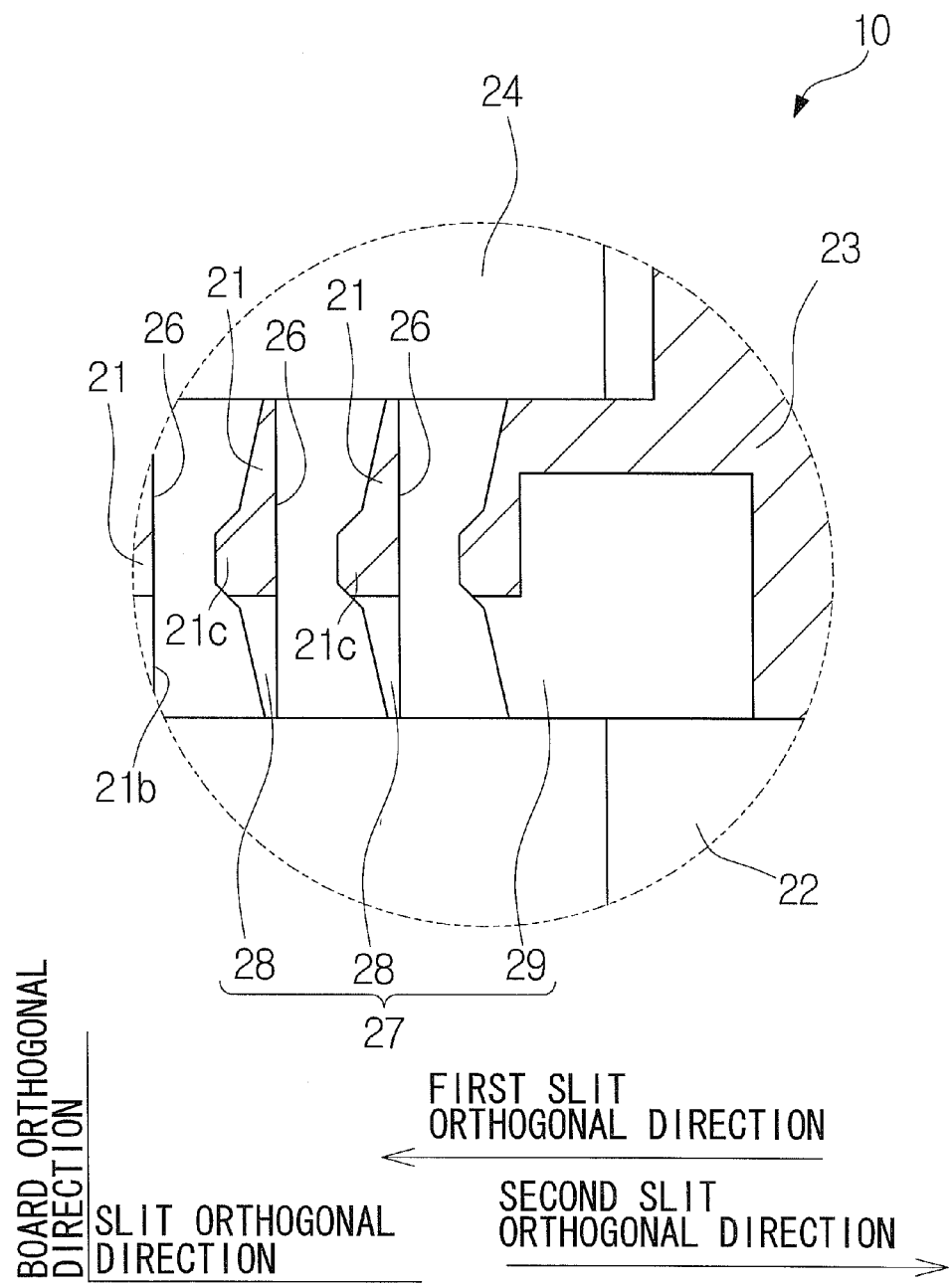
FIG. 11 is an enlarged view of a portion "B" shown in FIG. 10 (first exemplary embodiment)

As shown in FIG. 11, a slit frame reinforcement frame inserting groove 28 which is opened in the board approaching direction and the slit orthogonal direction is formed at an end in the board approaching direction of each slit frame 21. Similarly, each of the first outer peripheral frames 23 has an outer peripheral frame reinforcement frame inserting groove 29 which is opened in the board approaching direction. The plurality of slit frame reinforcement frame inserting grooves 28 and two outer peripheral frame reinforcement frame inserting grooves 29 constitute the frame body reinforcement frame inserting grooves 27 for mounting the reinforcement frames 12 on the frame body 10.

(Contact Block 11)

Figure 12:
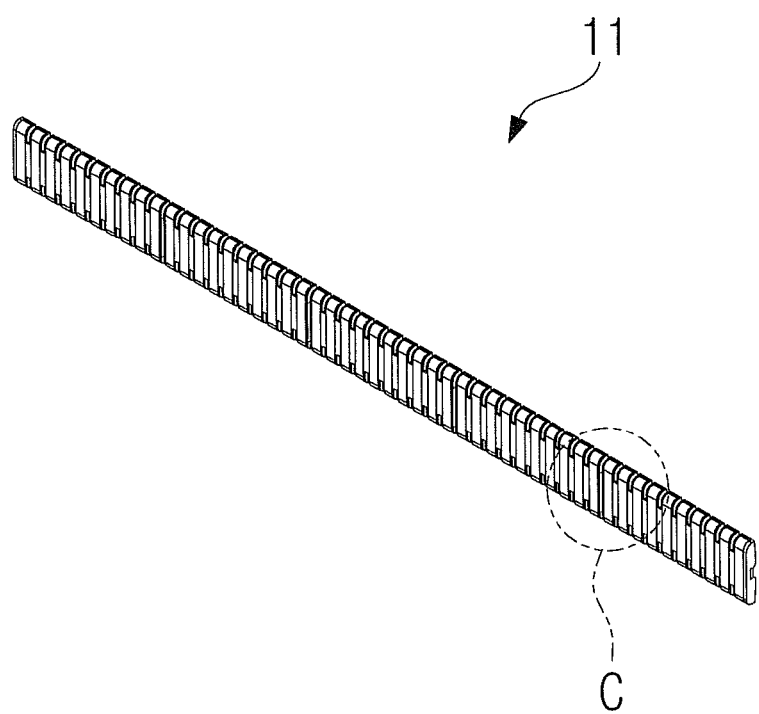
FIG. 12 is a perspective view of a contact block (first exemplary embodiment)
Figure 13:
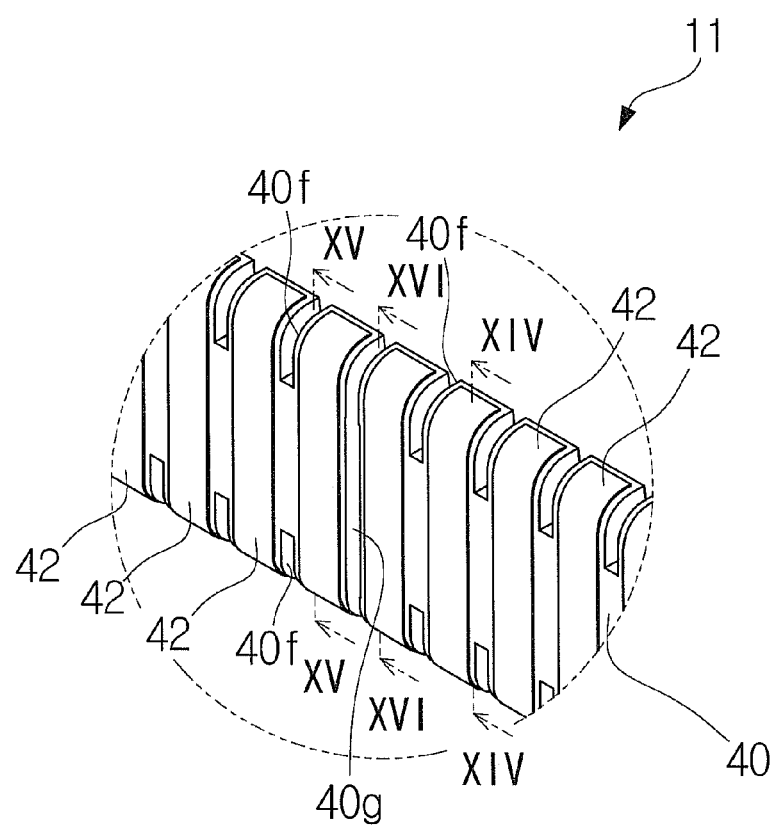
FIG. 13 is an enlarged view of a portion "C" shown in FIG. 12 (first exemplary embodiment)

FIGS. 12 and 13 show each contact block 11 used in the first exemplary embodiment. Each contact block 11 allows each electrode pad 6 of the printed wiring board 2 and each electrode pad (not shown) of the IC package 3 to be electrically conductive to each other. Each contact block 11 is inserted into the corresponding slit 26 between the adjacent slit frames 21 and is held on the frame body 10.

Figure 14:
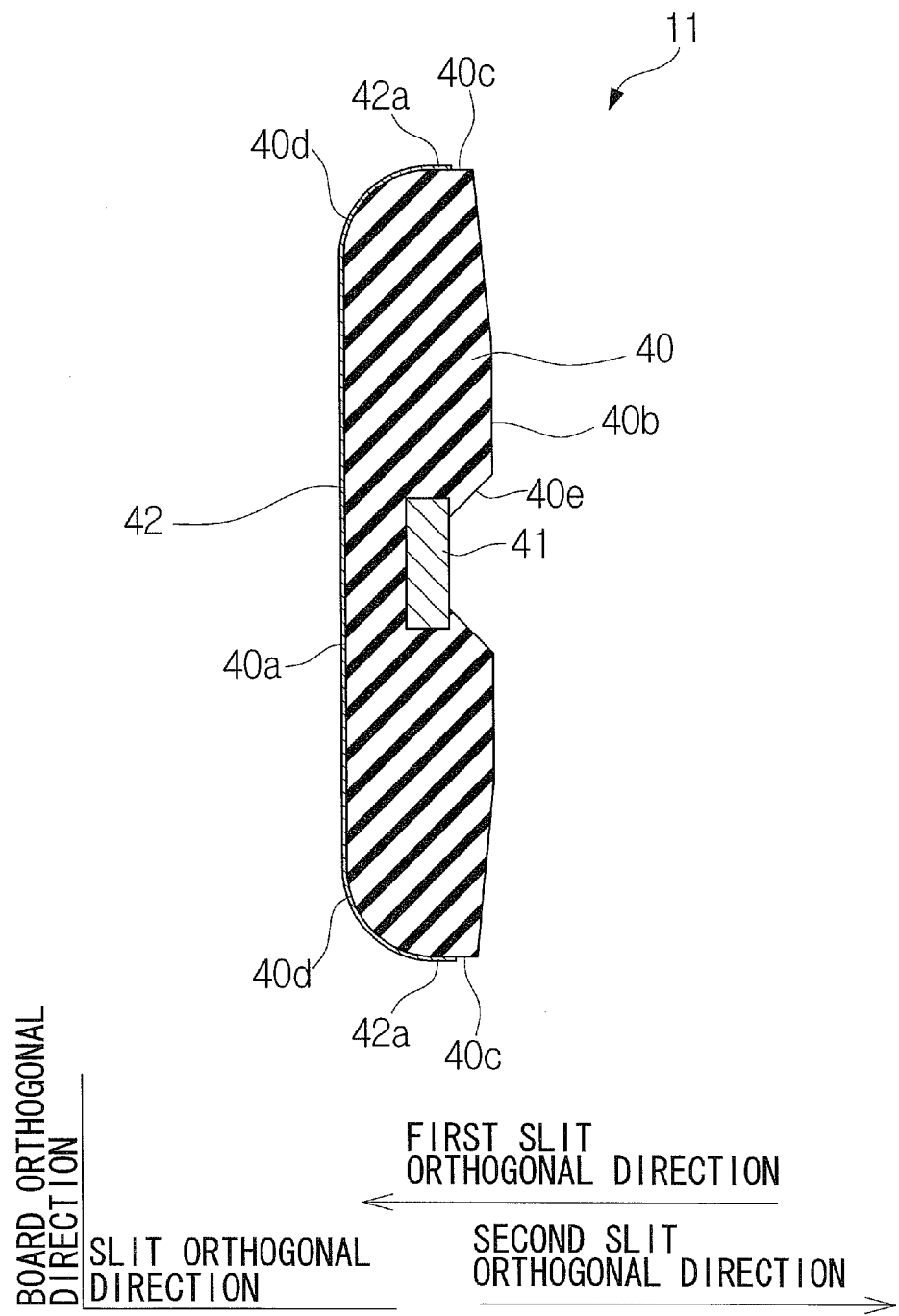
FIG. 14 is a sectional view taken along the line XIV-XIV of FIG. 13 (first exemplary embodiment)

As shown in FIG. 14, each contact block 11 includes a viscoelastic body 40, a core 41, and a plurality of conductors 42.

The core 41 adds a certain rigidity to each contact block 11 to thereby maintain the shape of each contact block 11, and improves the portability of each contact block 11 during a manufacturing process. The core 41 is formed of a highly rigid material such as metal, for example. The core 41 has a rectangular sectional shape and extends in the slit direction. The core 41 is manufactured by press working or etching, for example.

The viscoelastic body 40 holds the conductors 42 in a resiliently deformable manner. The viscoelastic body 40 is formed of a viscoelastic material such as silicon rubber or gel, for example. The viscoelastic body 40 is formed in a flat plate shape orthogonal to the slit orthogonal direction, and has a conductor-side side surface 40$a$, a non-conductor-side side surface 40$b$, a pair of contact surfaces 40$c$, and a pair of curved surfaces 40$d$. The conductor-side side surface 40$a$ is a flat surface facing the first slit orthogonal direction. The non-conductor-side side surface 40$b$ is a flat surface facing the second slit orthogonal direction. The pair of contact surfaces 40$c$ are flat surfaces respectively facing the board separating direction and the board approaching direction. Each curved surface 40$d$ is formed between the corresponding contact surface 40$c$ and the conductor-side side surface 40$a$. A dent 40$e$ (engaged portion) which is recessed in the first slit orthogonal direction is formed at a central portion in the board orthogonal direction of the non-conductor-side side surface 40$b$. The dent 40$e$ is formed in a penetrated manner along the slit direction. In the dent 40$e$, the core 41 is partially exposed. The viscoelastic body 40 is formed by insert molding with respect to the core 41, for example. Alternatively, the viscoelastic body 40 may be formed by punching a viscoelastic body formed into a sheet shape, or may be formed by performing laser machining on a viscoelastic body formed into a sheet shape.

The conductors 42 form a conductive path between the printed wiring board 2 and the IC package 3. As shown in FIG. 13, the conductors 42 are arranged on the viscoelastic body 40 at regular intervals in the slit direction. As shown in FIG. 14, each conductor 42 is formed so as to stride over one contact surface 40$c$, one curved surface 40$d$, the conductor-side side surface 40$a$, the other curved surface 40$d$, and the other contact surface 40$c$ in the stated order. Each conductor 42 includes a pair of conductor contact points 42$a$ respectively formed on the pair of contact surfaces 40$c$. Each conductor 42 may be formed directly on the viscoelastic body 40 by sputtering or the like, or may be formed by attaching a conductive film, which is obtained by patterning a conductive material on a polyimide film with a thickness of several micrometers, for example, onto the viscoelastic body 40.

Figure 15:
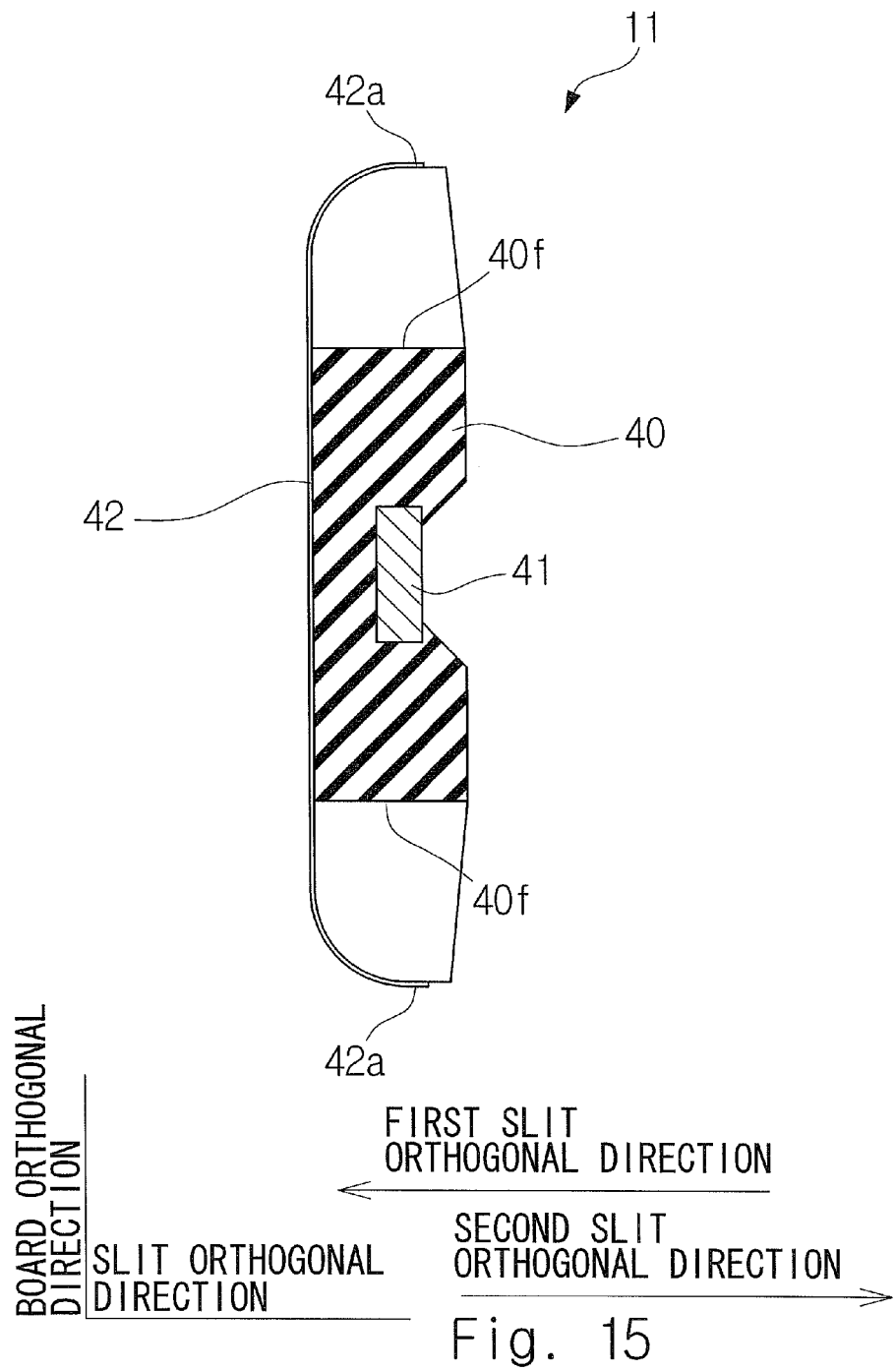
FIG. 15 is a sectional view taken along the line XV-XV of FIG. 13 (first exemplary embodiment)

As shown in FIG. 15, a pair of inter-terminal slits 40$f$ are formed at both ends in the board orthogonal direction of the viscoelastic body 40. The pair of inter-terminal slits 40$f$ are formed between the adjacent conductors 42 in the slit direction. The inter-terminal slits 40$f$ are formed between the adjacent conductors 42 in the slit direction, thereby allowing the conductor contact 42$a$ of each conductor 42 to be independently displaceable without being synchronized with the displacement of the conductor contact 42$a$ of the other of the adjacent conductors 42. The displacement independence as described above allows each conductor 42 to absorb a variation in the dimensional accuracy of the electrode pads of the printed wiring board 2 and the IC package 3.

Figure 16:
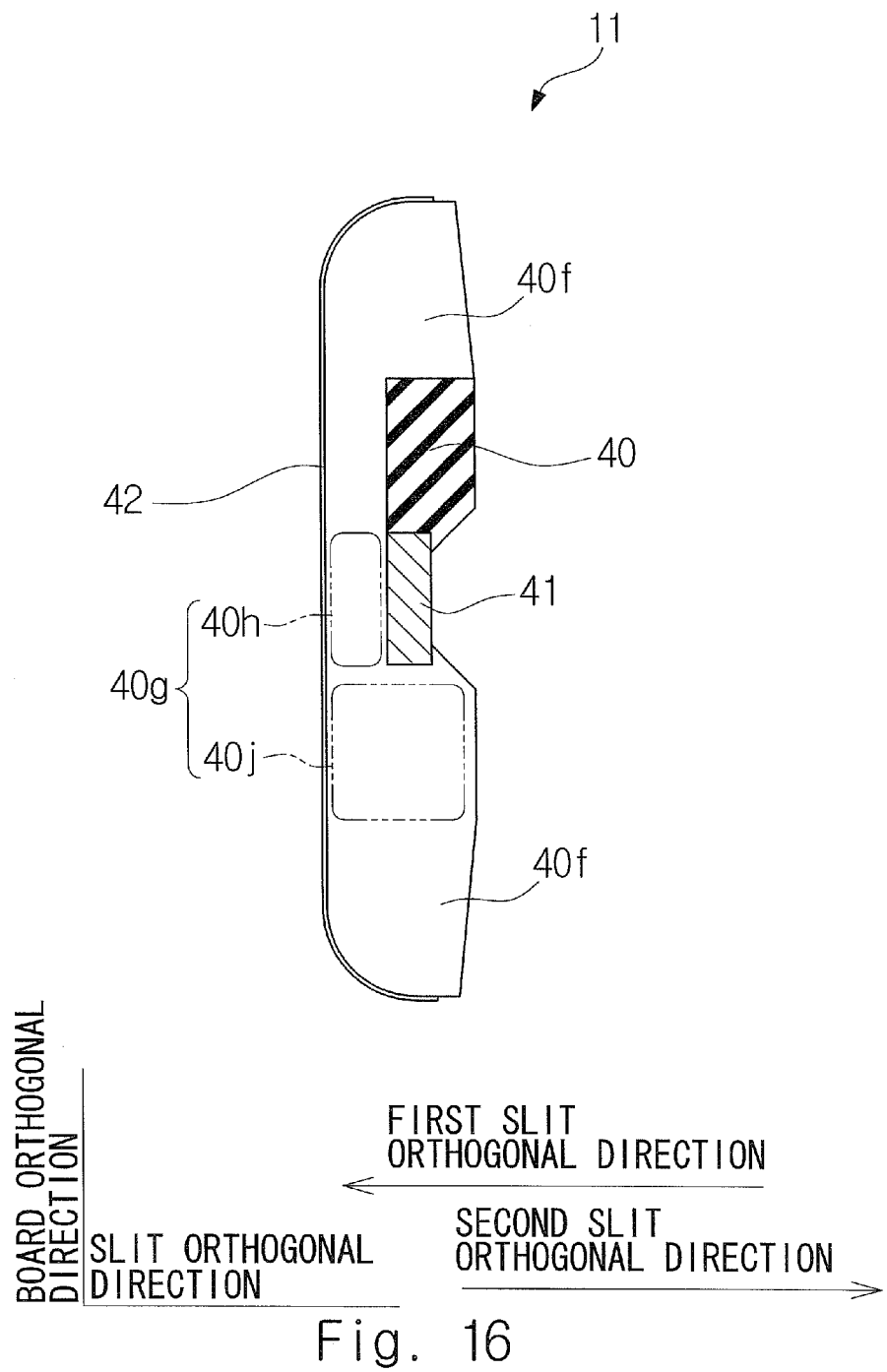
FIG. 16 is a sectional view taken along the line XVI-XVI of FIG. 13 (first exemplary embodiment)

As shown in FIG. 16, at an intersection between each contact block 11 and each reinforcement frame 12, the viscoelastic body 40 has viscoelastic body reinforcement frame inserting grooves 40$g$, in addition to the pair of inter-terminal slits 40$f$ described above. The viscoelastic body reinforcement frame inserting grooves 40$g$ are formed by removing the viscoelastic body 40 on the side of the first orthogonal direction relative to the core 41 and by removing the viscoelastic body 40 on the side of the board approaching direction relative to the core 41. The viscoelastic body reinforcement frame inserting grooves 40g include a viscoelastic body first reinforcement frame inserting groove 40h (protrusion inserting groove) formed on the side of the first slit orthogonal direction when viewed from the core 41, and a viscoelastic body second reinforcement frame inserting groove 40j (body inserting groove) formed on the side of the board approaching direction relative to the core 41.

(Reinforcement Frame 12)

Figure 17:
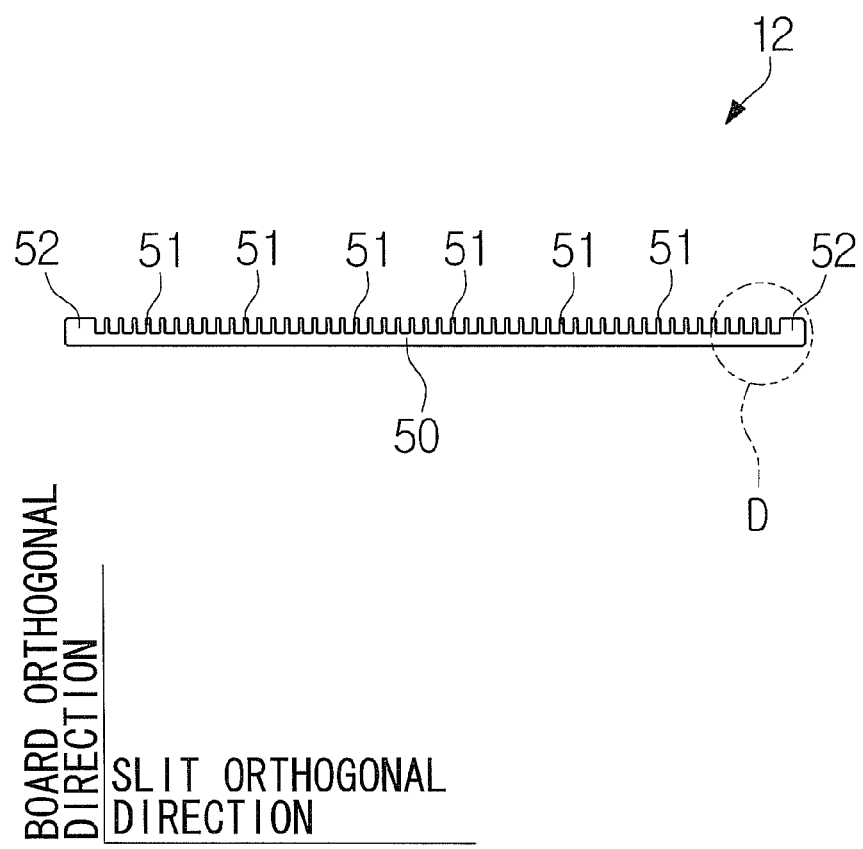
FIG. 17 is a front view of a reinforcement frame (first exemplary embodiment)
Figure 18:
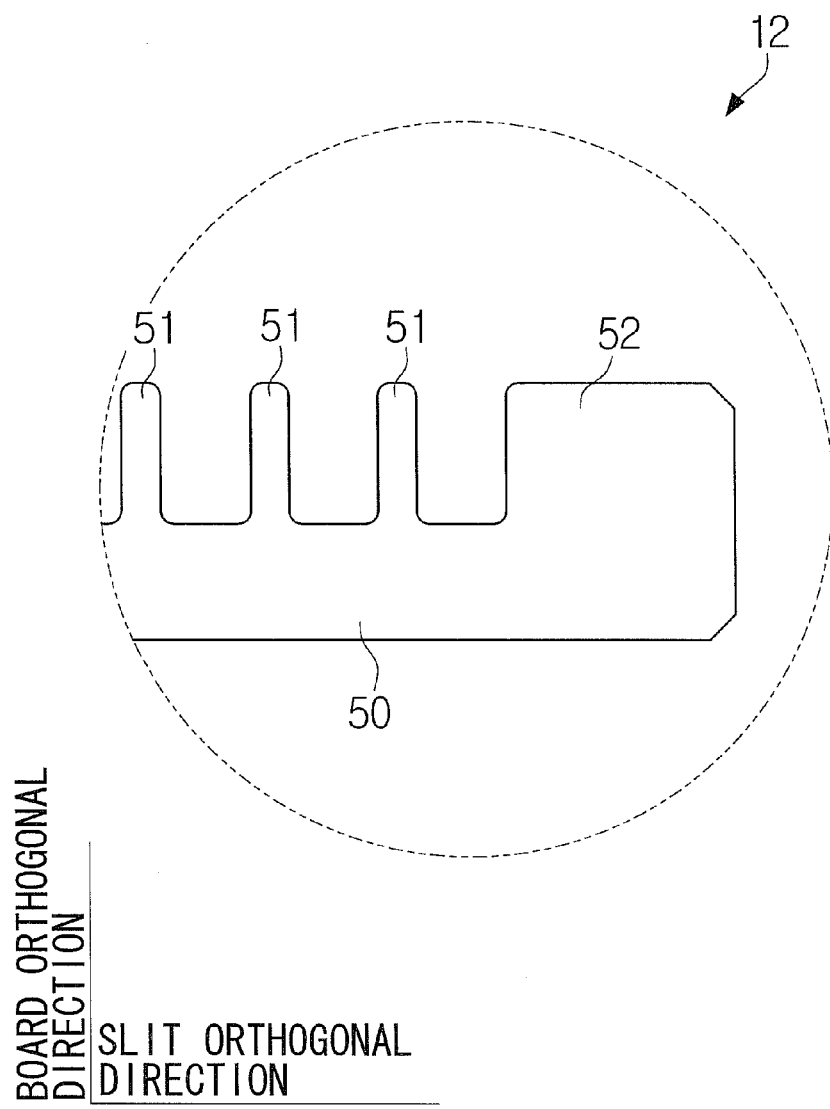
FIG. 18 is an enlarged view of a portion "D" shown in FIG. 17 (first exemplary embodiment)

Each reinforcement frame 12 shown in FIGS. 17 and 18 is formed so as to prevent each slit frame 21 from being easily deformed. Each reinforcement frame 12 is formed separately from the frame body 10 and is attached to the frame body 10 so as to intersect each slit frame 21. In the first exemplary embodiment, each reinforcement frame 12 is attached to the frame body 10 so as to be orthogonal to the slit frames 21 as shown in FIG. 6.

As shown in FIGS. 17 and 18, each reinforcement frame 12 includes a reinforcement frame body 50 extending so as to intersect each slit frame 21; a plurality of protrusions 51 protruding in the board separating direction from the reinforcement frame body 50 and inserted between the adjacent slit frames 21; and a pair of reinforcement frame ends 52 (ends). In the first exemplary embodiment, the reinforcement frames 12 are formed in a comb-teeth shape. In other words, each protrusion 51 is formed so as to protrude in an elongated straight shape in the board separating direction from the reinforcement frame body 50. The protrusions 51 are arranged at predetermined intervals. The pair of reinforcement frame ends 52 are respectively connected to both ends of the reinforcement frame body 50.

Each reinforcement frame 12 is formed by performing press working or laser machining on a highly rigid material, such as a resin sheet made of polyimide or the like, or a metallic plate, for example. The thickness of each reinforcement frame 12 is set to, for example, 0.1 mm, so as not to inhibit achieving a narrow pitch.

(Assembling Method)

Next, a method for assembling the socket 4 will be described.

Figure 19:
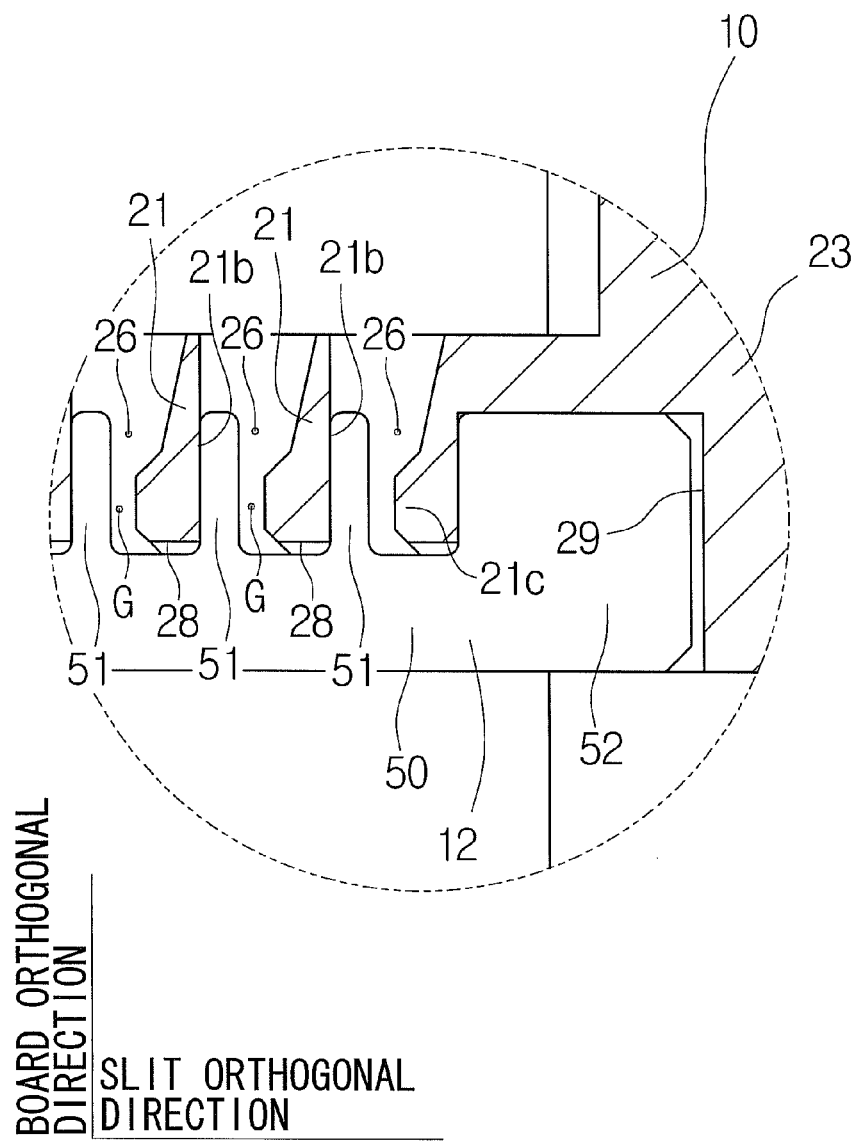
FIG. 19 is a sectional view showing a state in which the reinforcement frame is mounted to the frame body (first exemplary embodiment)

Referring first to FIG. 19, the reinforcement frames 12 are mounted on the frame body 10 from the side of the printed wiring board 2.

Specifically, the reinforcement frame ends 52 of each reinforcement frame 12 are inserted into the outer peripheral frame reinforcement frame inserting grooves 29 of the frame body 10. Similarly, the protrusions 51 of each reinforcement frame 12 are inserted into the slits 26 between the slit frames 21 of the frame body 10. Similarly, the reinforcement frame body 50 of each reinforcement frame 12 is inserted into each slit frame reinforcement frame inserting groove 28 between the slit frames 21 of the frame body 10.

In this state, as shown in FIG. 19, the protrusions 51 of each reinforcement frame 12 substantially contact the respective second slit side surfaces 21b of the slit frames 21. A gap G remains between each protrusion 51 of the reinforcement frame 12 and each protrusion 21c of the slit frame 21.

The reinforcement frames 12 can be fixed to the frame body 10 by a variety of methods. For example, (1) the reinforcement frame ends 52 of each reinforcement frame 12 are press-fit into the respective outer peripheral frame reinforcement frame inserting grooves 29 of the frame body 10; (2) laser welding, adhesion, or tape is employed. More alternatively, the reinforcement frames 12 may be fixed to the slit frames 21 of the frame body 10 by adhesion or the like, or may not be fixed thereto.

Figure 20:
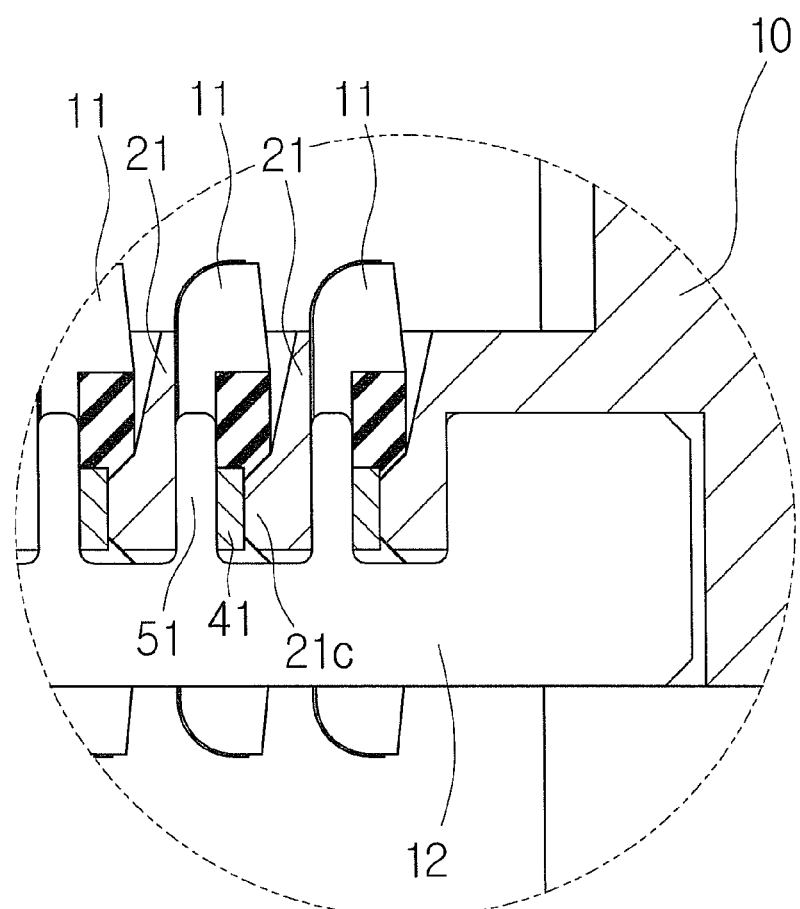
FIG. 20 is a sectional view showing a state in which the contact blocks are mounted in the state shown in FIG. 19 (first exemplary embodiment)

Referring next to FIG. 20, the contact blocks 11 are mounted on the frame body 10 from the side of the IC package 3.

Specifically, each contact block 11 is pressed into the corresponding slit 26 between the adjacent slit frames 21 shown in FIG. 19 from the side of the IC package 3. Then, each contact block 11 slides into the corresponding slit 26 between the adjacent slit frames 21 along with an elastic deformation of the viscoelastic body 40 shown in FIG. 14. After that, each protrusion 21c of the slit frame 21 shown in FIG. 9 is fit into the dent 40e of each contact block 11 shown in FIG. 14, so that each contact block 11 is held on the frame body 10.

At an intersection between each contact block 11 and each reinforcement frame 12, each protrusion 51 shown in FIG. 18 is inserted into the viscoelastic body first reinforcement frame inserting groove 40h of the viscoelastic body reinforcement frame inserting grooves 40g of each contact block 11 shown in FIG. 16. Similarly, the reinforcement frame body 50 of each reinforcement frame 12 shown in FIG. 18 is inserted into the viscoelastic body second reinforcement frame inserting groove 40j of the viscoelastic body reinforcement frame inserting grooves 40g of each contact block 11 shown in FIG. 16.

As shown in FIG. 20, each contact block 11 is sandwiched in the slit orthogonal direction between each slit frame 21 and each protrusion 51. Specifically, the core 41 of each contact block 11 is sandwiched in the slit orthogonal direction between each protrusion 21c of the slit frame 21 and each protrusion 51 of the reinforcement frame 12.

From another point of view, as shown in FIG. 20, each protrusion 51 of the reinforcement frame 12 is sandwiched in the slit orthogonal direction between each slit frame 21 and each contact block 11. Specifically, each protrusion 51 of the reinforcement frame 12 is sandwiched in the slit orthogonal direction between each slit frame 21 and the core 41 of each contact block 11.

Figure 21:
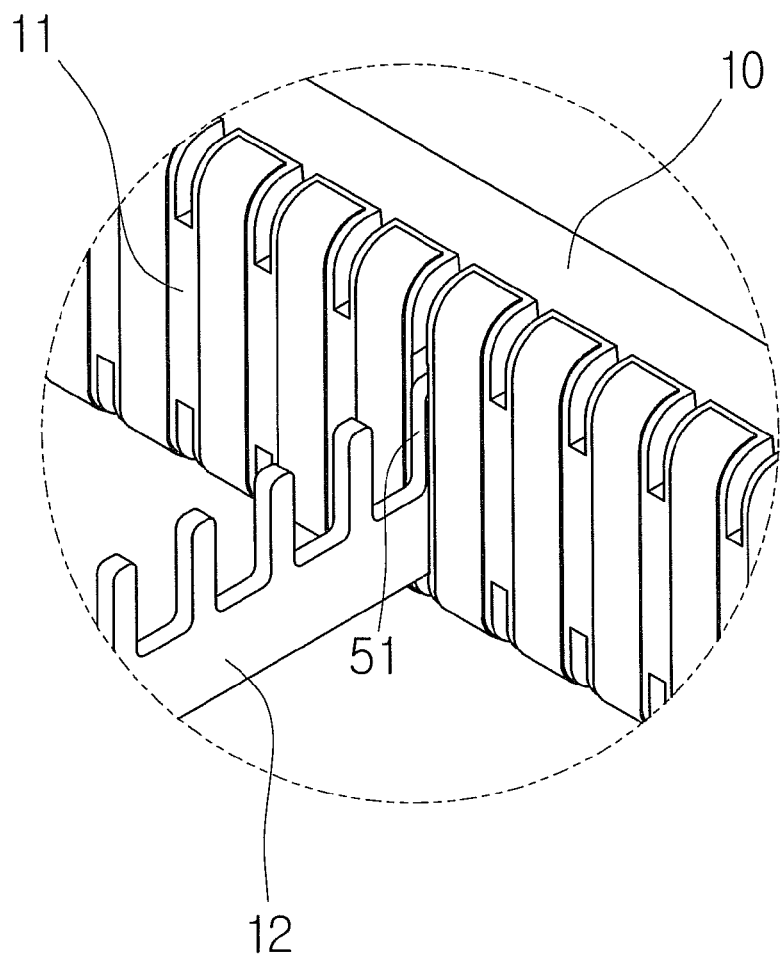
FIG. 21 is a supplementary perspective view showing assembly of the socket (first exemplary embodiment)
Figure 22:
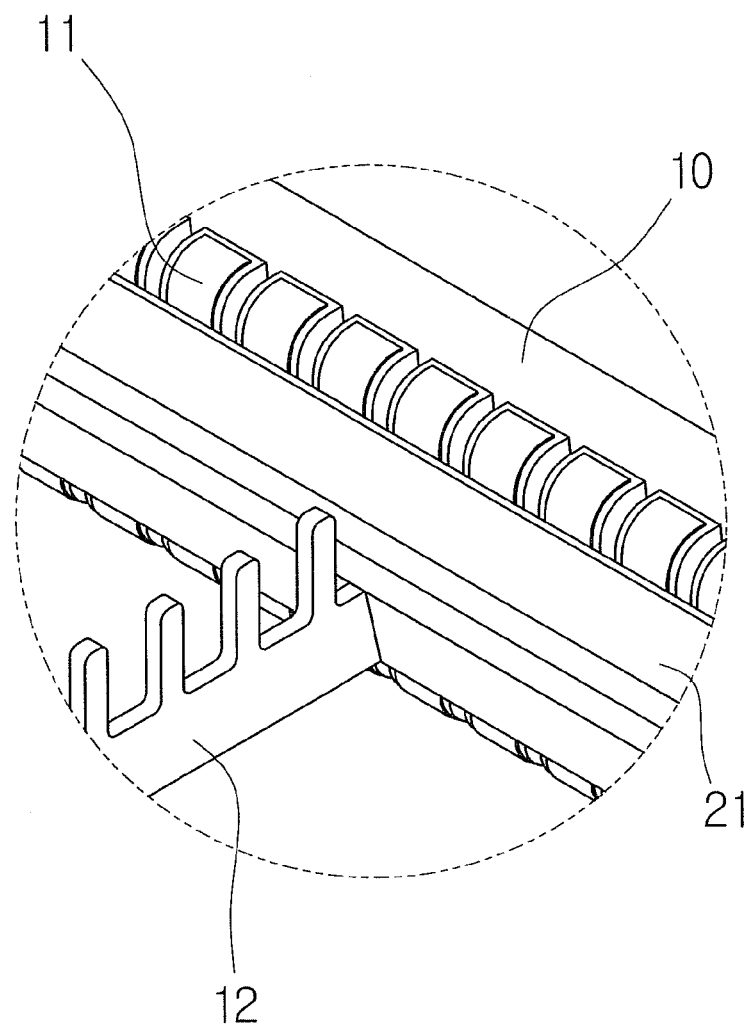
FIG. 22 is a supplementary perspective view showing assembly of the socket (first exemplary embodiment)

FIGS. 21 and 22 are perspective views in which illustration of a part of the slit frames 21 is omitted. FIG. 21 illustrates the positional relationship between each contact block 11 and each reinforcement frame 12. FIG. 22 illustrates the positional relationship among each contact block 11, each reinforcement frame 12, and each slit frame 21.

The first exemplary embodiment of the present invention has been described above, and the first exemplary embodiment has the following features.

(1) The socket 4 (electric connector) includes: the frame body 10 including the outer peripheral frame 20 and the plurality of elongated slit frames 21 arranged in parallel with each other on the inside of the outer peripheral frame 20; the plurality of contact blocks 11 (connection members) inserted between the adjacent slit frames 21 and held on the frame body 10; and the reinforcement frames 12 which are formed separately from the frame body 10 and mounted on the frame body 10 so as to intersect the slit frames 21. According to this structure, the reinforcement frames 12 intersect the slit frames 21, which prevents the slit frames 21 from being easily deformed and which causes no problem in terms of strength even when the slit frames 21 are reduced in thickness. Accordingly, instead of reducing the thickness of the contact blocks 11, the slit frames 21 are reduced in thickness, which contributes to achievement of a narrower pitch. That is, according to this structure, a narrower pitch can be achieved without causing any problem in terms of contact force and strength at each contact point.

(2) Each reinforcement frame 12 includes the reinforcement frame body 50 extending so as to intersect the slit frames 21, and the plurality of protrusions 51 which protrude from the reinforcement frame body 50 and are inserted between the adjacent slit frames 21. According to this structure, the deformation of the slit frames 21, which widens or narrows each slit 26 between the adjacent slit frames 21, for example, can be effectively suppressed.

(3) Each contact block 11 is sandwiched between each slit frame 21 and each protrusion 51 of each reinforcement frame 12. According to this structure, the reinforcement frames 12 contribute to holding of the contact blocks 11 by the frame body 10, and improve the position accuracy of the contact blocks 11.

(4) Each contact blocks 11 includes the viscoelastic body 40 and the core 41. The core 41 of each contact block 11 is sandwiched between each slit frame 21 and each protrusion 51 of each reinforcement frame 12. According to this structure, the reinforcement frames 12 further contribute to holding of the contact blocks 11 by the frame body 10, and further improve the position accuracy of the contact blocks 11.

(5) The viscoelastic body 40 of each contact block 11 has the viscoelastic body first reinforcement frame inserting groove 40h (protrusion inserting groove) in which the protrusion 51 of each reinforcement frame 12 is inserted.

(6) The viscoelastic body 40 of each contact block 11 has the viscoelastic body second reinforcement frame inserting groove 40j (body inserting groove) in which the reinforcement frame body 50 of each reinforcement frame 12 is inserted.

(7) The protrusions 51 of each reinforcement frame 12 are formed in a comb-teeth shape.

(10) The outer peripheral frame 20 has the outer peripheral frame reinforcement frame inserting grooves 29 in which the reinforcement frame ends 52 (ends) of the reinforcement frames 12 are inserted.

(11) The slit frames 21 have the slit frame reinforcement frame inserting grooves 28 in which the reinforcement frames 12 are inserted.

In the first exemplary embodiment, the reinforcement frames 12 are formed separately from the frame body 10. Hereinafter, consideration is given to the case where the reinforcement frames 12 are formed integrally with the frame body 10. It is reasonable to perform injection molding of the frame body 10 by causing a molten resin to flow in the longitudinal direction of each slit frame 21. Meanwhile, since the reinforcement frames 12 intersect the slit frames 21, the flow passage is bent at a right angle, which makes it extremely difficult to form the frame body 10 by injection molding as described above. Accordingly, in this case, it is necessary to increase the thickness of each slit frame 21 so as to improve the mobility of the molten resin during formation of each slit frame 21. An increase in thickness of each slit frame 21 results in inhibiting a reduction in pitch. For the reasons described above, the structure in which the reinforcement frames 12 are formed separately from the frame body 10 and then the reinforcement frames 12 are mounted on the frame body 10 greatly contributes to a reduction in pitch.

Second Exemplary Embodiment

Figure 23:
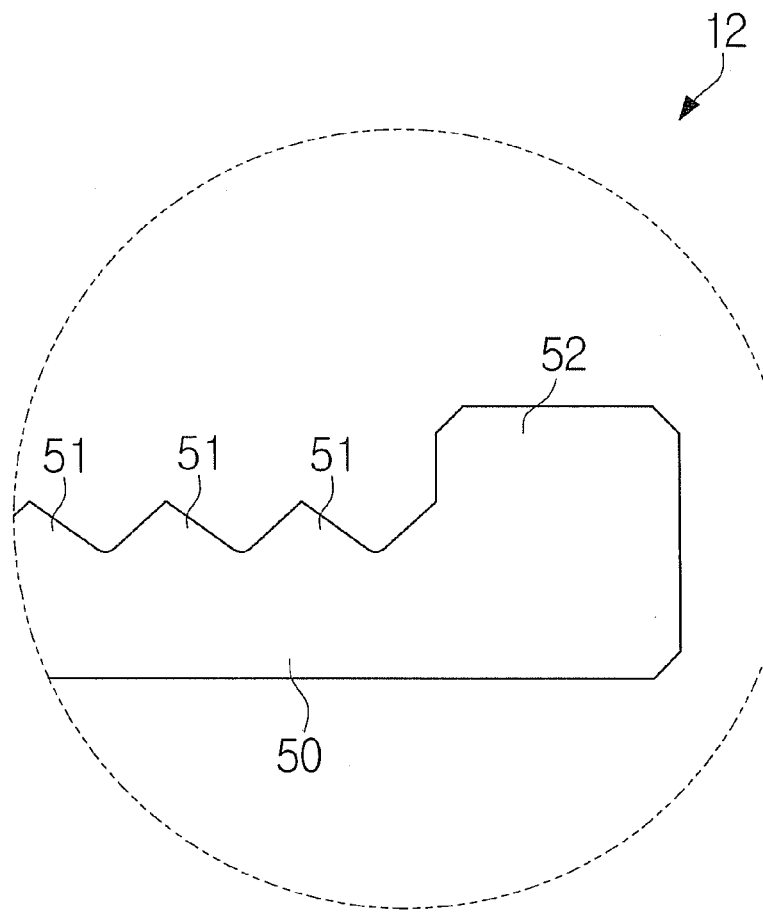
FIG. 23 is a front view of a reinforcement frame (second exemplary embodiment)
Figure 24:
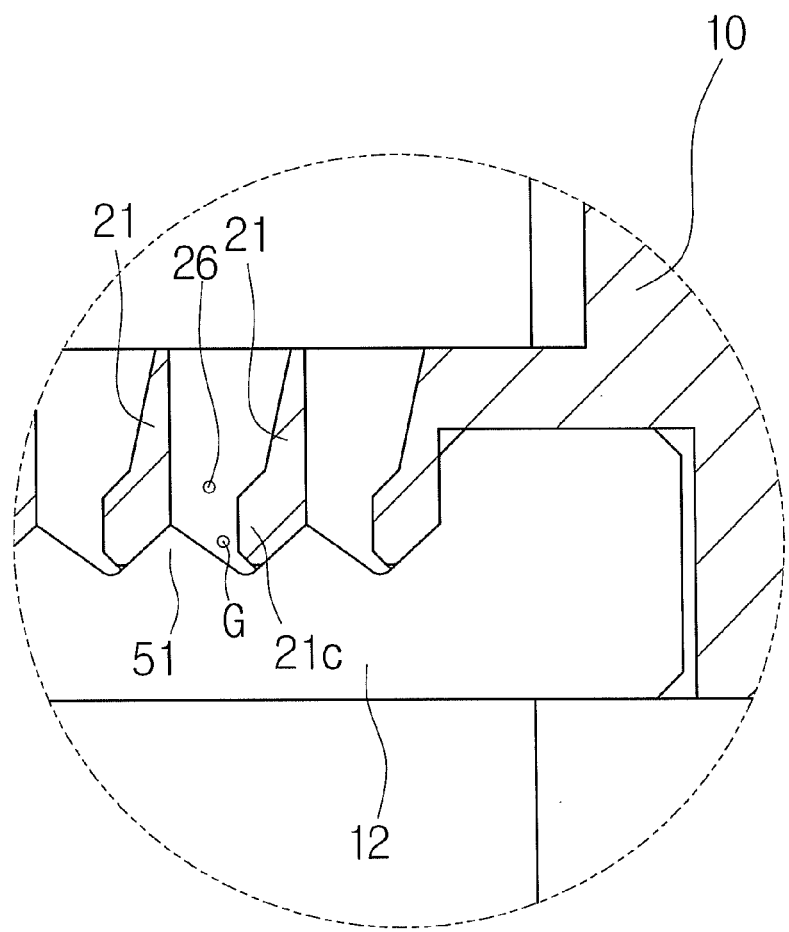
FIG. 24 is a sectional view showing a state in which the reinforcement frame is mounted to a frame body (second exemplary embodiment)

A second exemplary embodiment of the present invention will be described with reference to FIGS. 23 to 25. In the second exemplary embodiment, the differences from the first exemplary embodiment described above are mainly described and a repeated explanation is omitted as appropriate. The components corresponding to the respective components of the first exemplary embodiment are denoted by the same reference numerals as a general rule.

As shown in FIG. 18, in the first exemplary embodiment described above, the reinforcement frames 12 are formed in a comb-teeth shape. Meanwhile, in the second exemplary embodiment, the reinforcement frames 12 are formed in a triangular wave shape. That is, each protrusion 51 is formed to protrude in a triangular shape in the board separating direction from the reinforcement frame body 50. Also in the second exemplary embodiment, as in the first exemplary embodiment, the protrusions 51 of each reinforcement frame 12 are inserted into the respective slits 26 between each slit frame 21 of the frame body 10 as shown in FIG. 24. In this state, the gap G remains between each protrusion 51 of each reinforcement frame 12 and each protrusion 21c of each slit frame 21.

Figure 25:
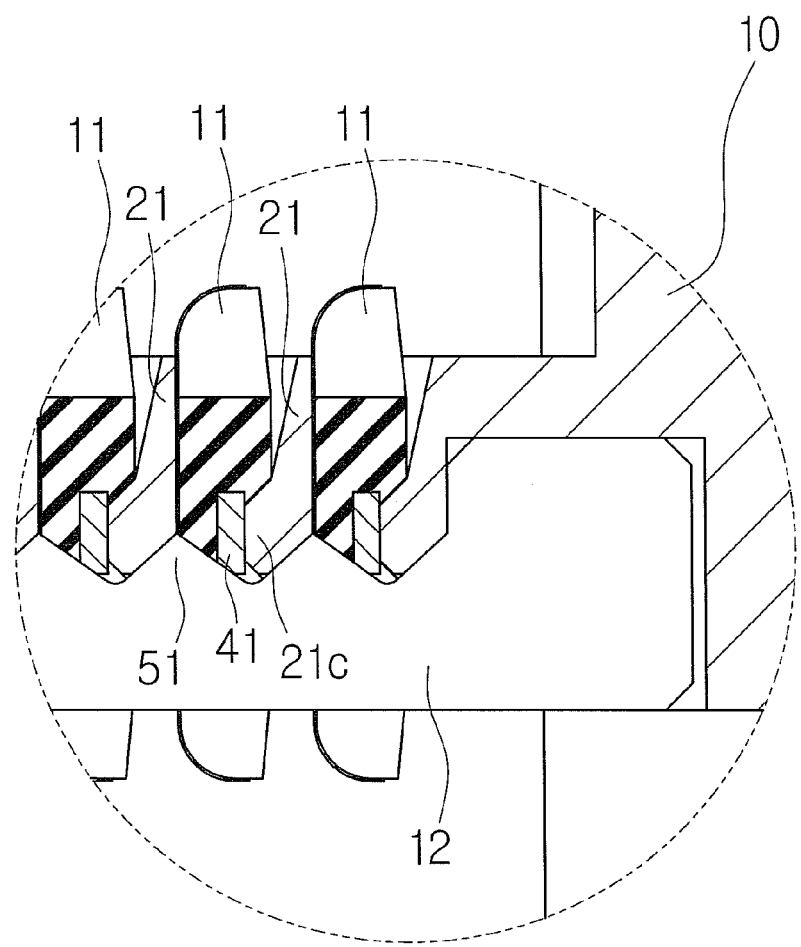
FIG. 25 is a sectional view showing a state in which contact blocks are mounted in the state shown in FIG. 24 (second exemplary embodiment)

Referring next to FIG. 25, when the contact blocks 11 are mounted on the frame body 10 from the side of the IC package 3, each contact block 11 is sandwiched between each slit frame 21 and each protrusion 51. Specifically, the core 41 of each contact block 11 is sandwiched between each protrusion 21c of each slit frame 21 and each protrusion 51 of each reinforcement frame 12.

Third Exemplary Embodiment

Figure 26:
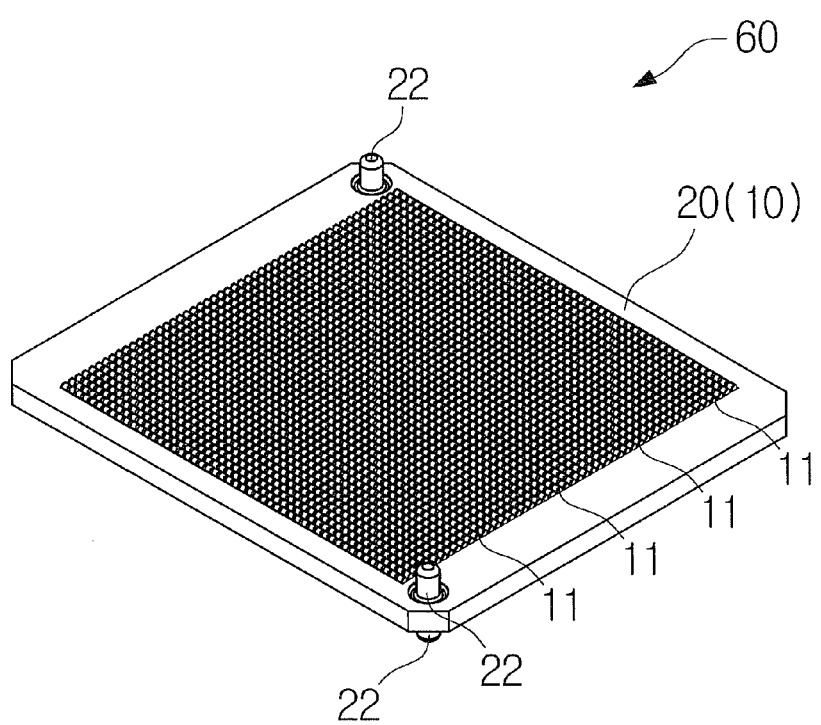
FIG. 26 is a perspective view of a board-to-board connector (third exemplary embodiment)

Next, a third exemplary embodiment of the present invention will be described with reference to FIG. 26. In the third exemplary embodiment, the differences from the first exemplary embodiment described above are mainly described and a repeated explanation is omitted as appropriate. The components corresponding to the respective components of the first exemplary embodiment are denoted by the same reference numerals as a general rule.

In the first exemplary embodiment described above, a socket is illustrated as an example of the electric connector. Meanwhile, in the third exemplary embodiment, a board-to-board connector 60 is illustrated as an example of the electric connector, in place of the socket. The board-to-board connector 60 includes the frame body 10, the plurality of contact blocks 11, and the plurality of reinforcement frames 12 (not shown). In the third exemplary embodiment, the frame body 10 is formed in a flat shape. Accordingly, each contact block 11 protrudes upward and downward from the frame body 10. The outer peripheral frame 20 constituting the frame body 10 has two positioning pins 22 protruding upward and two positioning pins 22 protruding downward.

Fourth Exemplary Embodiment

Next, a fourth exemplary embodiment of the present invention will be described with reference to FIGS. 27 and 28. In the fourth exemplary embodiment, the differences from the first exemplary embodiment described above are mainly described and a repeated explanation is omitted as appropriate. The components corresponding to the respective components of the first exemplary embodiment are denoted by the same reference numerals as a general rule.

In the first exemplary embodiment described above, as shown in FIG. 19, when the protrusions 51 of each reinforcement frame 12 are inserted into the respective slits 26 of the frame body 10, the gap G remains between each protrusion 51 and each protrusion 21c of each slit frame 21, and the core 41 of each contact block 11 is inserted into the gap G. In this case, however, it is necessary to reduce the width in the slit orthogonal direction of each protrusion 51.

Figure 27:
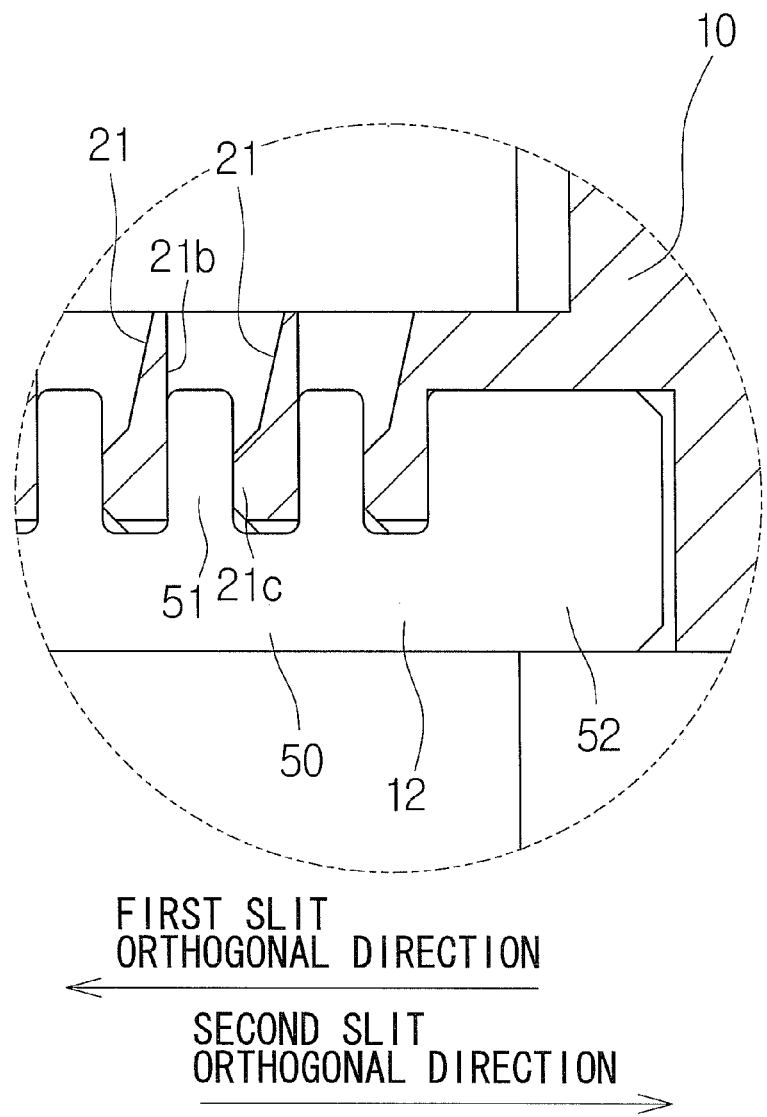
FIG. 27 is a sectional view showing a state in which a reinforcement frame is mounted on a frame body (fourth exemplary embodiment)
Figure 28:
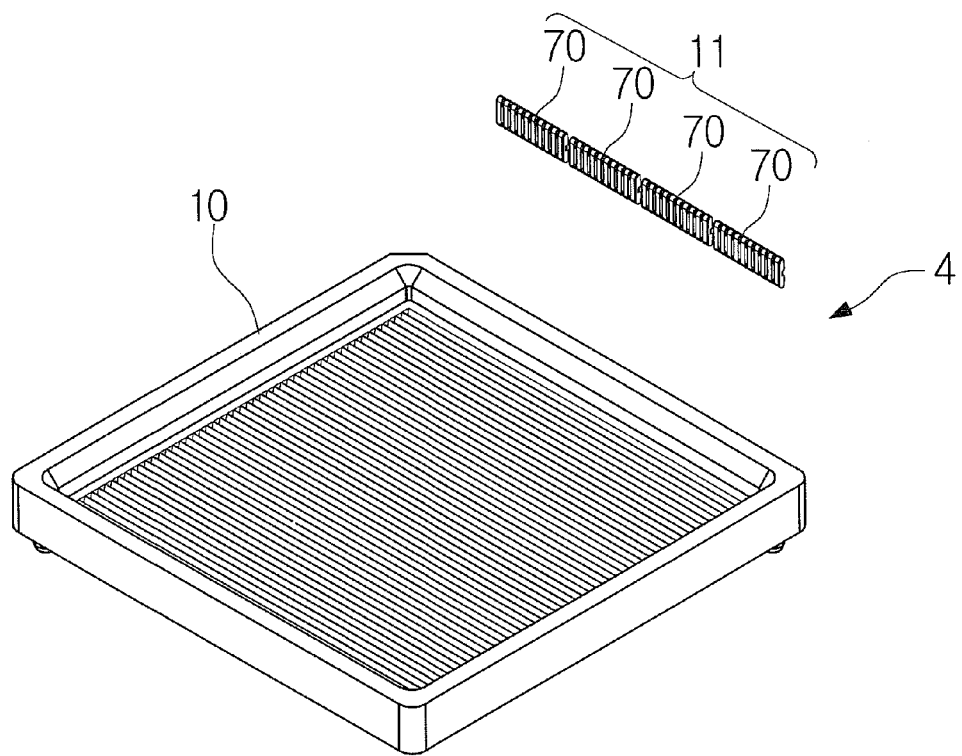
FIG. 28 is an exploded perspective view of a socket (the reinforcement frame is not shown) (fourth exemplary embodiment)
Figure 29:
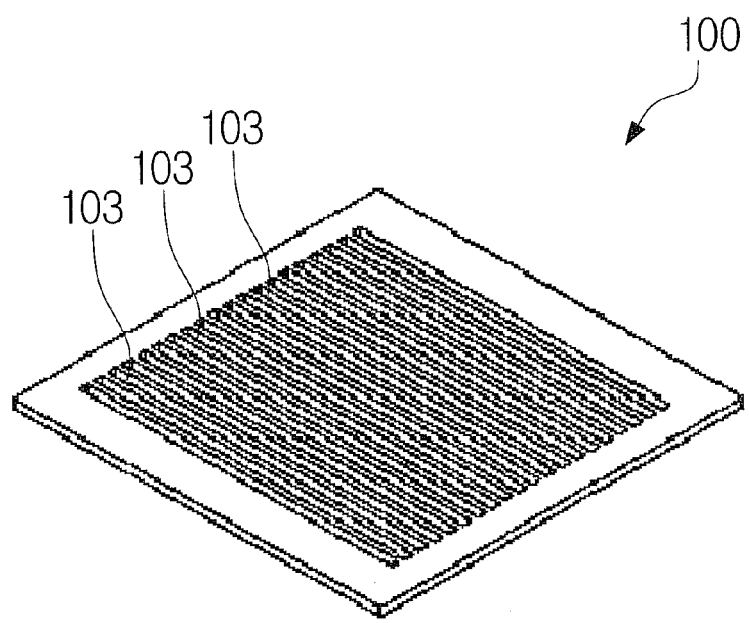
FIG. 29 is a diagram corresponding to FIG. 5 of Japanese Unexamined Patent Application Publication No. 2005-108656.
Figure 30:
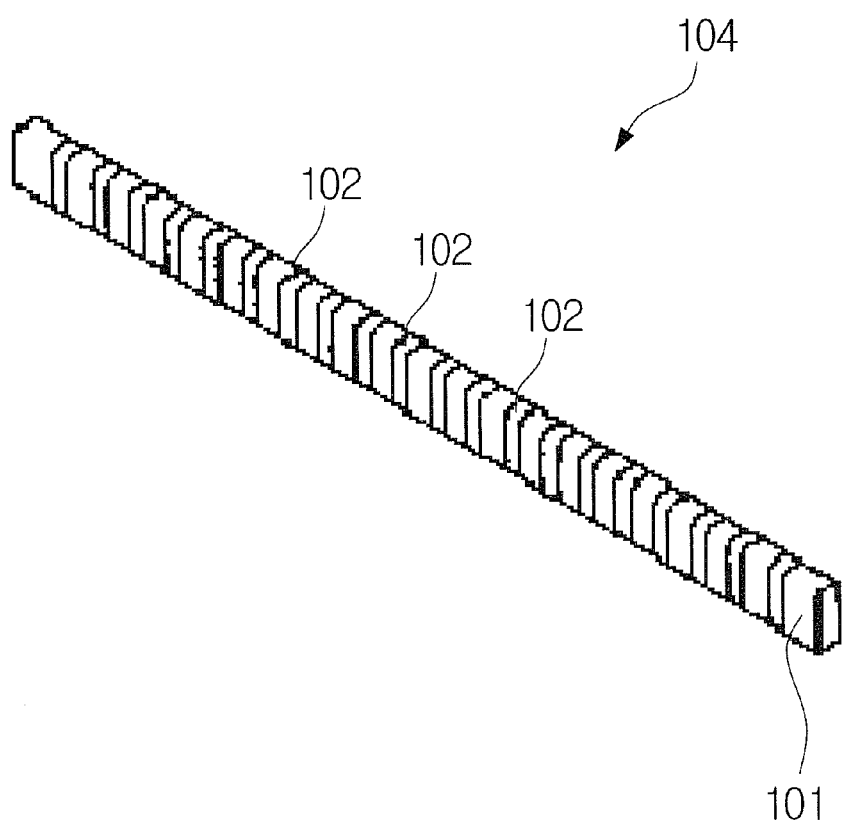
FIG. 30 is a diagram corresponding to FIG. 6 of Japanese Unexamined Patent Application Publication No. 2005-108656.

On the other hand, in the fourth exemplary embodiment, as shown in FIG. 27, when the width in the slit orthogonal direction of the protrusions 51 of each reinforcement frame 12 is set to be larger than that of the first exemplary embodiment and when the protrusions 51 of each reinforcement frame 12 are inserted into the respective slits 26 of the frame body 10, no gap remains between each protrusion 51 and each protrusion 21c of each slit frame 21. In other words, each protrusion 51 contacts the second slit side surface 21b of each slit frame 21 in the first slit orthogonal direction when viewed from the protrusion 51, and also contacts the protrusion 21c of each slit frame 21 in the second slit orthogonal direction when viewed from the protrusion 51.

In this case, if no countermeasure is taken, the core 41 of each contact block 11 and the protrusion 51 of each reinforcement frame 12 physically interfere with each other. Accordingly, in the fourth exemplary embodiment, as shown in FIG. 28, each contact block 11 is divided at a position intersecting the reinforcement frames 12. In other words, in the fourth exemplary embodiment, each contact block 11 is formed of a plurality of contact block pieces 70 arranged in the slit direction.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An electric connector comprising:
    a frame body including an outer peripheral frame and a plurality of elongated slit frames, the slit frames being arranged in parallel with each other on an inside of the outer peripheral frame in a slit direction;
    a plurality of connection members inserted between the adjacent slit frames and held on the frame body;
    a reinforcement frame formed separately from the frame body and mounted on the frame body so as to intersect the plurality of slit frames in a slit orthogonal direction,
    wherein the slit direction is orthogonal to the slit orthogonal direction and a board orthogonal direction is orthogonal to the slit direction and the slit orthogonal direction and
    wherein the frame body has at least one frame body reinforcement frame inserting groove in which the reinforcement frame is inserted.

2. The electric connector according to claim 1, wherein the reinforcement frame includes a reinforcement frame body extending so as to intersect the plurality of slit frames, and a plurality of protrusions protruding from the reinforcement frame body and inserted between the adjacent slit frames.

3. The electric connector according to claim 2, wherein each of the connection members is sandwiched between each of the slit frames and each of the protrusions of the reinforcement frame.

4. The electric connector according to claim 3, wherein each of the connection members comprises a viscoelastic body and a core, and the core of each of the connection members is sandwiched between each of the slit frames and each of the protrusions of the reinforcement frame.

5. The electric connector according to claim 4, wherein the viscoelastic body of each of the connection members has a protrusion inserting groove in which each of the protrusions of the reinforcement frame is inserted.

6. The electric connector according to claim 4, wherein the viscoelastic body of each of the connection members has a body inserting groove in which the reinforcement frame body of the reinforcement frame is inserted.

7. The electric connector according to claim 2, wherein the plurality of protrusions of the reinforcement frame is formed in a comb-teeth shape.

8. The electric connector according to claim 2, wherein the plurality of protrusions of the reinforcement frame is formed in a triangular wave shape.

9. The electric connector according to claim 2, wherein each of the connection members is divided at a position of the reinforcement frame.

10. The electric connector according to claim 1, wherein the outer peripheral frame has an outer peripheral frame reinforcement frame inserting groove in which the reinforcement frame is inserted.

11. The electric connector according to claim 1, wherein the plurality of slit frames has a slit frame reinforcement frame inserting groove in which the reinforcement frame is inserted.

12. The electric connector according to claim 1, wherein the reinforcement frame is one of a metallic plate or a resin sheet.

* * * * *